US012635393B2

(12) United States Patent
Lee et al.

(10) Patent No.: US 12,635,393 B2

(45) Date of Patent: May 19, 2026

(54) DISPLAY APPARATUS

(71) Applicant: Samsung Display Co., Ltd., Yongin-si (KR)

(72) Inventors: Mihwa Lee, Yongin-si (KR); Sujeong Kim, Yongin-si (KR); Kyunghee Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 801 days.

(21) Appl. No.: 17/870,595

(22) Filed: Jul. 21, 2022

(65) Prior Publication Data

US 2023/0112955 A1 Apr. 13, 2023

(30) Foreign Application Priority Data

Oct. 6, 2021 (KR) ........................ 10-2021-0132686

(51) Int. Cl.

*H10K 59/80* (2023.01)

*H10K 59/122* (2023.01)

(Continued)

(52) U.S. Cl.

CPC ......... *H10K 59/878* (2023.02); *H10K 59/122* (2023.02); *H10K 59/352* (2023.02); *H10K 59/353* (2023.02); *H10K 59/38* (2023.02)

(58) Field of Classification Search

CPC .... H10K 59/38; H10K 59/122; H10K 59/352; H10K 59/353; H10K 59/40; H10K 59/873; H10K 59/8791; H10K 59/878; H10K 59/123; H10K 59/00–95; H10K 59/173; H10K 59/126; H10K 50/856; H10K 50/844; H10K 50/00–88; H10K 50/854;

(Continued)

(56) References Cited

U.S. PATENT DOCUMENTS

| | | | |
|---|---|---|---|
| 9,798,183 B2 | 10/2017 | Kimura et al. |
| 10,243,031 B2 | 3/2019 | Lee et al. |

(Continued)

FOREIGN PATENT DOCUMENTS

| | | | |
|---|---|---|---|
| KR | 10-2018-0027706 A | 3/2018 |
| KR | 10-2018-0082661 A | 7/2018 |

(Continued)

*Primary Examiner* — Steven B Gauthier

*Assistant Examiner* — Adam D Weiland

(74) *Attorney, Agent, or Firm* — Womble Bond Dickinson (US) LLP

(57) ABSTRACT

A display apparatus includes: a substrate; a first light-emitting device, a second light-emitting device, and a third light-emitting device on the substrate and having respective emission areas, the first light-emitting device, the second light-emitting device, and the third light-emitting device being configured to emit light having different wavelengths from each other; a low-reflection layer on the first light-emitting device, the second light-emitting device, and the third light-emitting device, the low-reflection layer including an inorganic material; a color filter layer on the low-reflection layer and configured to transmit light in a first wavelength region corresponding to the second light-emitting device; and a reflection control layer on the color filter layer and including a dye, a pigment, or a combination thereof.

18 Claims, 21 Drawing Sheets

(51) Int. Cl.
*H10K 59/35* (2023.01)
*H10K 59/38* (2023.01)

(58) Field of Classification Search
CPC ........... H10K 50/852; H10K 2101/351; H10K 2101/00–90; H10K 2102/00–361; G02B 1/02; G02B 5/08; G02B 5/201; G02B 5/223
See application file for complete search history.

(56) References Cited

U.S. PATENT DOCUMENTS

| | | | | |
|---|---|---|---|---|
| 10,510,810 | B2 | 12/2019 | Kim et al. | |
| 11,016,325 | B2 | 5/2021 | Kwon et al. | |
| 11,165,049 | B2 | 11/2021 | Joo et al. | |
| 2016/0079567 | A1* | 3/2016 | Cho | H10K 59/8792 257/40 |
| 2018/0083227 | A1* | 3/2018 | Ju | H10K 85/1135 |
| 2019/0157354 | A1* | 5/2019 | Lee | H10K 50/84 |
| 2019/0181189 | A1* | 6/2019 | Chang | H10K 59/351 |
| 2020/0075682 | A1* | 3/2020 | Jeong | G02B 5/0242 |
| 2021/0193741 | A1* | 6/2021 | Chen | H10K 59/8792 |
| 2022/0206613 | A1* | 6/2022 | Choi | H10K 50/844 |
| 2022/0302217 | A1* | 9/2022 | Ding | H10K 50/865 |

FOREIGN PATENT DOCUMENTS

| | | | |
|---|---|---|---|
| KR | 10-1948053 | B1 | 4/2019 |
| KR | 10-2019-0080312 | A | 7/2019 |
| KR | 10-2034073 | B1 | 10/2019 |
| KR | 10-2020-0006206 | A | 1/2020 |
| KR | 10-2020-0054382 | A | 5/2020 |
| KR | 10-2151502 | B1 | 9/2020 |

* cited by examiner

FIG. 9

| | Layer | OPTICAL DENSITY |
|---|---|---|
| A | BLACK MATRIX | 0.8~4.5 |
| B | ANTI-REFLECTION LAYER (LIGHT-BLOCKING AREA) | 1.3~ |

DISPLAY APPARATUS

CROSS-REFERENCE TO RELATED APPLICATION

This application claims priority to and the benefit of Korean Patent Application No. 10-2021-0132686, filed on Oct. 6, 2021, in the Korean Intellectual Property Office, the present disclosure of which is incorporated by reference herein in its entirety.

BACKGROUND

1. Field

Aspects of embodiments of the present disclosure relate to a display apparatus.

2. Description of the Related Art

Recently, display apparatuses have been used for various purposes. As display apparatuses have become thinner and lighter, the range of applications has increased, and as display apparatuses have been used in various fields, the demand for display apparatuses providing high-quality images has increased.

Organic light-emitting display apparatuses, from among the various display apparatuses, are self-luminous. Different from liquid crystal display apparatuses, organic light-emitting display apparatuses do not require separate light sources, and thus, thicknesses and weights thereof may be reduced. Also, organic light-emitting display apparatuses have high quality characteristics such as low power consumption, high luminance, and fast response time.

Conventional display apparatuses, however, may suffer reduced visibility due to the reflection of external light.

SUMMARY

One or more embodiments of the present disclosure include a display apparatus exhibiting improved visibility. The display apparatus, according to some embodiments, includes a low-reflection layer and a reflection control layer on a light-emitting device to improve visibility. However, this and other embodiments described herein are examples and do not limit the scope of the present disclosure.

Additional aspects and features will be set forth, in part, in the description which follows and, in part, will be apparent from the description or may be learned by practice of the presented embodiments.

According to an embodiment, a display apparatus includes: a substrate; a first light-emitting device, a second light-emitting device, and a third light-emitting device on the substrate and having respective emission areas, the first light-emitting device, the second light-emitting device, and the third light-emitting device being configured to emit light having different wavelengths from each other; a low-reflection layer on the first light-emitting device, the second light-emitting device, and the third light-emitting device, the low-reflection layer including an inorganic material; a color filter layer on the low-reflection layer and configured to transmit light in a first wavelength region corresponding to the second light-emitting device; and a reflection control layer on the color filter layer and including a dye, a pigment, or a combination thereof.

The color filter layer may have a first opening and a third opening respectively corresponding to the first light-emitting device and the third light-emitting device from among the first light-emitting device, the second light-emitting device, and the third light-emitting device.

The reflection control layer may have a second opening corresponding to the second light-emitting device.

A size of the second opening may be smaller than each of the first opening and the third opening.

The reflection control layer may fill the first opening and the third opening.

The color filter layer and the reflection control layer may not overlap each other to correspond to the first light-emitting device, the second light-emitting device, and the third light-emitting device.

Only the color filter layer from among the color filter layer and the reflection control layer may be arranged to correspond to the second light-emitting device.

Only the reflection control layer from among the color filter layer and the reflection control layer may be arranged to correspond to the first light-emitting device and the third light-emitting device.

A non-emission area may be between the emission areas, and the non-emission area may have a light-blocking area at where the color filter layer and the reflection control layer overlap each other.

An optical density of the light-blocking area corresponding to the non-emission area may be equal to or greater than 1.3.

The first wavelength region may be a range from 500 nm to 580 nm.

The low-reflection layer may include at least one of a metal and a metal oxide.

The low-reflection layer may include ytterbium (Yb), bismuth (Bi), cobalt (Co), molybdenum (Mo), titanium (Ti), zirconium (Zr), aluminum (Al), chromium (Cr), niobium (Nb), platinum (Pt), tungsten (W), indium (In), tin (Sn), iron (Fe), nickel (Ni), tantalum (Ta), manganese (Mn), zinc (Zn), germanium (Ge), silver (Ag), magnesium (Mg), gold (Au), copper (Cu), calcium (Ca), or a combination thereof.

The low-reflection layer may include $SiO_2$, $TiO_2$, $ZrO_2$, $Ta_2O_5$, $HfO_2$, $Al_2O_3$, ZnO, $Y_2O_3$, BeO, MgO, $PbO_2$, $WO_3$, SiNx, LiF, $CaF_2$, $MgF_2$, CdS, or a combination thereof.

A refractive index of the low-reflection layer may be equal to or greater than 1.

An absorption coefficient of the low-reflection layer may be equal to or less than 4.0.

The first light-emitting device may include a first pixel electrode, the second light-emitting device may include a second pixel electrode, and the third light-emitting device may include a third pixel electrode. The display apparatus may further include a pixel-defining film covering edges of the first pixel electrode, the second pixel electrode, and the third pixel electrode, the pixel-defining film may have an opening portion through which a central portion of each of the first pixel electrode, the second pixel electrode, and the third pixel electrode is exposed. The pixel-defining film may include a light-blocking material.

The display apparatus may further include: a thin-film encapsulation layer on the low-reflection layer; and a touch sensing layer on the thin-film encapsulation layer and including a conductive layer corresponding to a non-emission area between the emission areas. The color filter layer may be on the touch sensing layer.

A width of each of the color filter layer and the reflection control layer overlapping the conductive layer may be greater than a width of the conductive layer.

The display apparatus may further include a capping layer on the first light-emitting device, the second light-emitting device, and the third light-emitting device. The capping layer may include an organic material, and the low-reflection layer may be directly on the capping layer.

Other aspects and features of the present disclosure will become more apparent from the drawings, claims, and detailed description.

BRIEF DESCRIPTION OF THE DRAWINGS

The above and other aspects and features of embodiments of the present disclosure will be more apparent from the following description taken in conjunction with the accompanying drawings, in which:

FIG. 9 is a table showing optical densities of a light-blocking area of an anti-reflection layer according to an embodiment and a comparative example;

DETAILED DESCRIPTION

Figure 1:
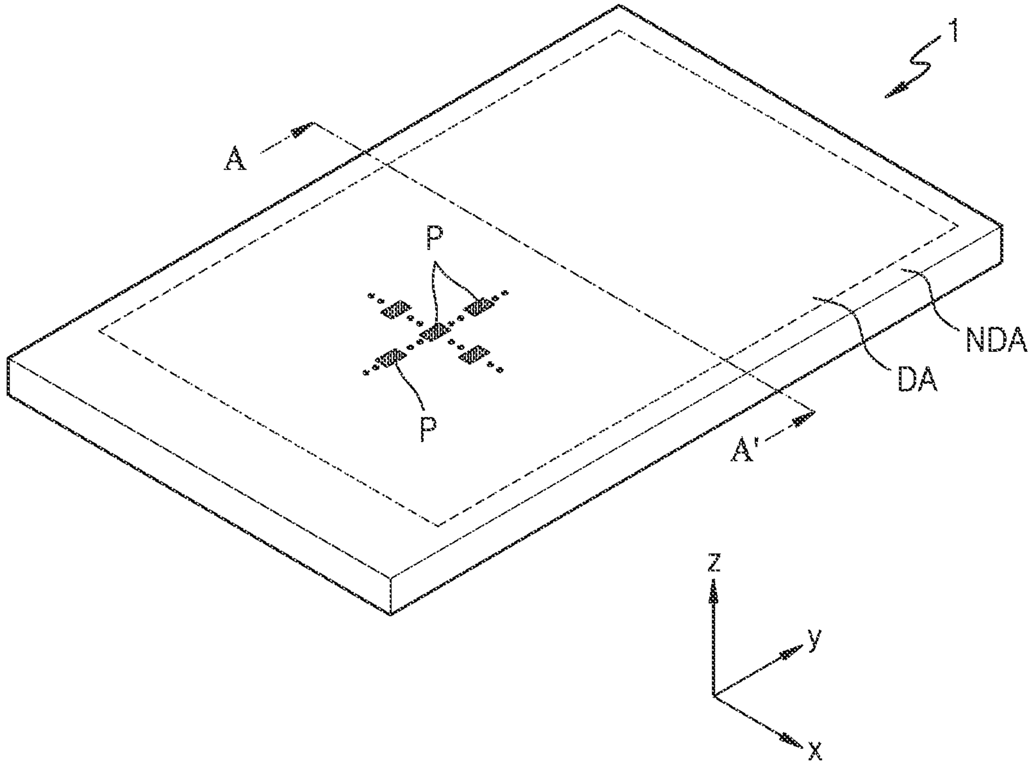
FIG. 1 is a perspective view illustrating a display apparatus, according to an embodiment.

Reference will now be made, in detail, to embodiments, examples of which are illustrated in the accompanying drawings. Like reference numerals refer to like elements throughout. In this regard, the present embodiments may have different forms and should not be construed as being limited to the descriptions set forth herein. Accordingly, the embodiments are merely described below, by referring to the figures, to explain aspects and features of the present disclosure. As used herein, the term "and/or" includes any and all combinations of one or more of the associated listed items. Throughout the present disclosure, the expression "at least one of a, b, or c" indicates only a, only b, only c, both a and b, both a and c, both b and c, all of a, b, and c, or variations thereof.

As the present disclosure allows for various changes and numerous embodiments, certain embodiments will be illustrated in the drawings and described in the detailed description. Aspects and features of the present disclosure, and methods for achieving them, will be described with reference to embodiments described below, in detail, with reference to the drawings. However, the present disclosure is not limited to the following embodiments and may be embodied in various forms.

In the specification, while such terms as "first," "second," etc. may be used to describe various components, such components are not be limited to the above terms. The above terms are used only to distinguish one component from another.

The singular forms "a," "an," and "the" as used herein are intended to include the plural forms as well unless the context clearly indicates otherwise.

In the specification, it is to be understood that the terms "including," "having," and "comprising" are intended to indicate the existence of features or components described in the specification, and are not intended to preclude the possibility that one or more other features or components may be added.

In the specification, it will be further understood that, when a layer, region, or component is referred to as being "on" another layer, region, or component, it may be directly on the other layer, region, or component, or may be indirectly on the other layer, region, or component with intervening layers, regions, or components therebetween.

In the specification, it will be understood that when a layer, an area, or an element is referred to as being "connected" to another layer, area, or element, it may be "directly connected" to the other layer, area, or element and/or may be "indirectly connected" to the other layer, area, or element with other layers, areas, or elements interposed therebetween. For example, when a layer, an area, or an element is referred to as being "electrically connected," it may be directly electrically connected, and/or may be indirectly electrically connected with intervening layers, areas, or elements therebetween.

"A and/or B" is used herein to select only A, select only B, or select both A and B. "At least one of A and B" is used to select only A, select only B, or select both A and B.

In the specification, the x-axis, the y-axis, and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

In the specification, when a certain embodiment may be implemented differently, a specific process order may be different from the described order. For example, two consecutively described processes may be performed substantially at the same time or may be performed in an order opposite to the described order.

Sizes of layers, components, etc. in the drawings may be exaggerated or contracted for convenience of explanation. For example, because sizes and thicknesses of layer or elements in the drawings may be arbitrarily illustrated for convenience of explanation, the present disclosure is not limited thereto.

FIG. 1 is a perspective view illustrating a display apparatus, according to an embodiment.

Referring to FIG. 1, a display apparatus 1 according to an embodiment may include a display area DA and a non-display area NDA outside the display area DA. Although the display area DA illustrated in FIG. 1 has a substantially rectangular shape, the present disclosure is not limited thereto. The display area DA may have any of various shapes, such as a circular shape, an elliptical shape, or a polygonal shape.

The display area DA is a portion where an image is displayed, and a plurality of pixels P may be located in the display area DA. The term "pixel" used herein may refer to "sub-pixel". Each pixel P may include a light-emitting device, such as an organic light-emitting diode. Each pixel P may emit, for example, red light, green light, blue light, or white light.

The display area DA may provide a certain image through light emitted by the pixels P. The term "pixel P" used herein may be defined as an emission area that emits light of one color from among red, green, blue, or white as described above.

The non-display area NDA is where the pixels P are not located and may be an area where an image is not provided. A pad unit connected to a driver integrated circuit (IC) or a printed circuit board including a driving circuit and a power supply wiring configured to drive the pixels P may be located in the non-display area NDA.

Hereinafter, an organic light-emitting display apparatus will be described as an example of the display apparatus 1 according to an embodiment. However, the display apparatus of the present disclosure is not limited thereto. That is, the display apparatus of the present disclosure may be a display apparatus, such as an inorganic light-emitting display apparatus (or an inorganic electroluminescence (EL) display apparatus) or a quantum dot light-emitting display apparatus. For example, an emission layer included in a light-emitting device provided in the display apparatus may include an organic material or an inorganic material. Quantum dots may be located in a path of light emitted by the emission layer.

Figure 2:
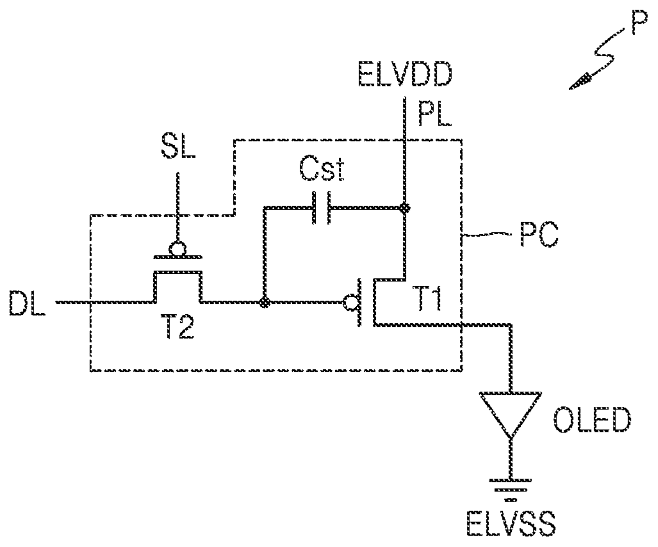
FIG. 2 is a diagram illustrating a display element provided in one pixel of a display apparatus and a pixel circuit connected to the display element, according to an embodiment.

FIG. 2 is a diagram illustrating a display element provided in one pixel of a display apparatus and a pixel circuit connected to the display element, according to an embodiment.

Referring to FIG. 2, an organic light-emitting diode OLED, that is a display element, is connected to a pixel circuit PC. The pixel circuit PC may include a first thin-film transistor T1, a second thin-film transistor T2, and a storage capacitor Cst. For example, the organic light-emitting diode OLED may emit red light, green light, or blue light, or may emit red light, green light, blue light, or white light.

The second thin-film transistor T2, that is a switching thin-film transistor, may be connected to a scan line SL and a data line DL and may transmit a data voltage input from the data line DL to the first thin-film transistor T1 according to a switching voltage input from the scan line SL. The storage capacitor Cst may be connected to the second thin-film transistor T2 and a driving voltage line PL and may store a voltage corresponding to a difference between a voltage received from the second thin-film transistor T2 and a first power supply voltage ELVDD supplied to the driving voltage line PL.

The first thin-film transistor T1, that is a driving thin-film transistor, may be connected to the driving voltage line PL and the storage capacitor Cst and may control driving current flowing through the organic light-emitting diode OLED from the driving voltage line PL according to a value of the voltage stored in the storage capacitor Cst. The organic light-emitting diode OLED may emit light having a certain luminance due to the driving current. A counter electrode (e.g., a cathode) of the organic light-emitting diode OLED may receive a second power supply voltage ELVSS.

Although the pixel circuit PC illustrated in FIG. 2 includes two thin-film transistors and one storage capacitor, in other embodiments, the number of thin-film transistors and/or the number of storage capacitors may be modified in various ways according to a design of the pixel circuit PC.

Figure 3:
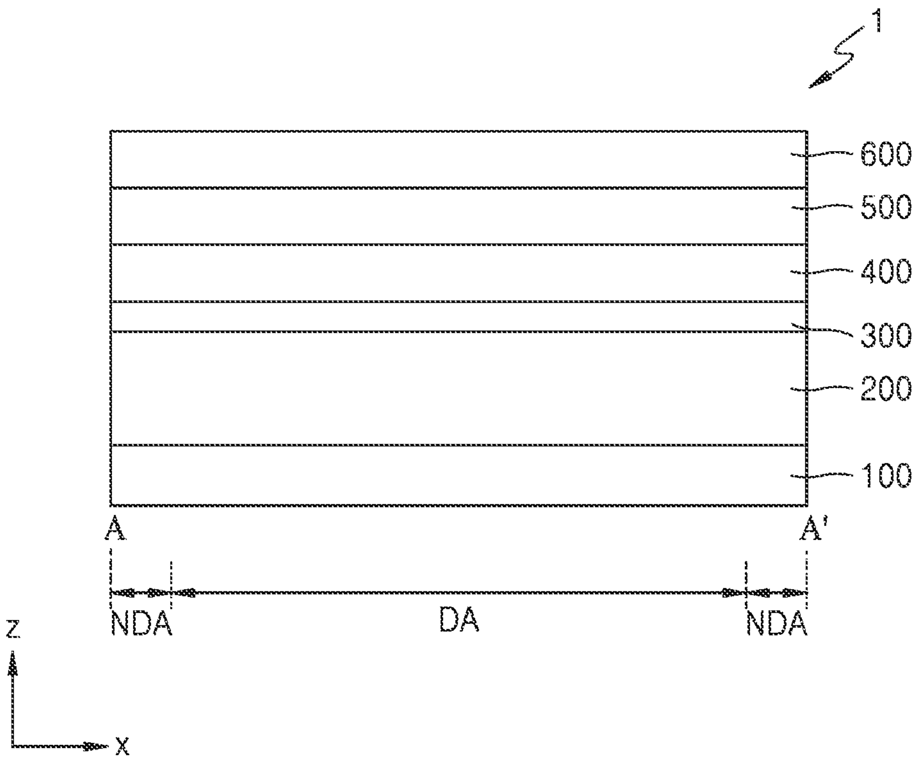
FIG. 3 is a cross-sectional view taken along the line A-A' of FIG. 1.

FIG. 3 is a cross-sectional view of the display apparatus 1 taken along the line A-A' of FIG. 1.

Referring to FIG. 3, the display apparatus 1 according to an embodiment may include a substrate 100, a display layer 200, a low-reflection layer 300, a thin-film encapsulation layer 400, a touch sensing layer 500, and an anti-reflection layer 600.

The substrate 100 may include glass or a polymer resin. For example, the polymer resin may include polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 including the polymer resin may be flexible, rollable, or bendable. The substrate 100 may have a multi-layer structure including a layer including a polymer resin and an inorganic layer.

The display layer 200 may include an organic light-emitting diode, that is a light-emitting device, a thin-film transistor electrically connected to the organic light-emitting diode, and insulating layers located therebetween.

The low-reflection layer 300 may be located on the display layer 200, and the thin-film encapsulation layer 400 may be located on the low-reflection layer 300. For example, the display layer 200 and/or the low-reflection layer 300 may be sealed by the thin-film encapsulation layer 400. The thin-film encapsulation layer 400 may include at least one inorganic layer and at least one organic layer.

In another embodiment, an encapsulation substrate formed of a glass material, instead of the thin-film encapsulation layer 400, may be provided. The encapsulation substrate may be located on the display layer 200, and the display layer 200 may be located between the substrate 100 and the encapsulation substrate. There may be a gap between the encapsulation substrate and the display layer 200, and the gap may be filled with a filler.

The touch sensing layer 500 may be located on the thin-film encapsulation layer 400. The touch sensing layer 500 may be configured to sense an external input, for example, a touch of an object, such as a finger or a stylus pen, so that the display apparatus 1 obtains coordinate information corresponding to a touch position. The touch sensing layer 500 may include a touch electrode and trace lines connected to the touch electrode. The touch sensing layer 500 may sense an external input by using a mutual capacitance method or a self-capacitance method.

The touch sensing layer 500 may be located on the thin-film encapsulation layer 400. In an embodiment, the touch sensing layer 500 may be formed directly on the thin-film encapsulation layer 400. In other embodiments, the touch sensing layer 500 may be separately formed and adhered to the thin-film encapsulation layer 400 through an adhesive layer, such as an optically clear adhesive (OCA).

The anti-reflection layer 600 may be located on the touch sensing layer 500. The anti-reflection layer 600 may reduce a reflectance of light (e.g., external light) incident on the display apparatus 1.

Figure 4A:
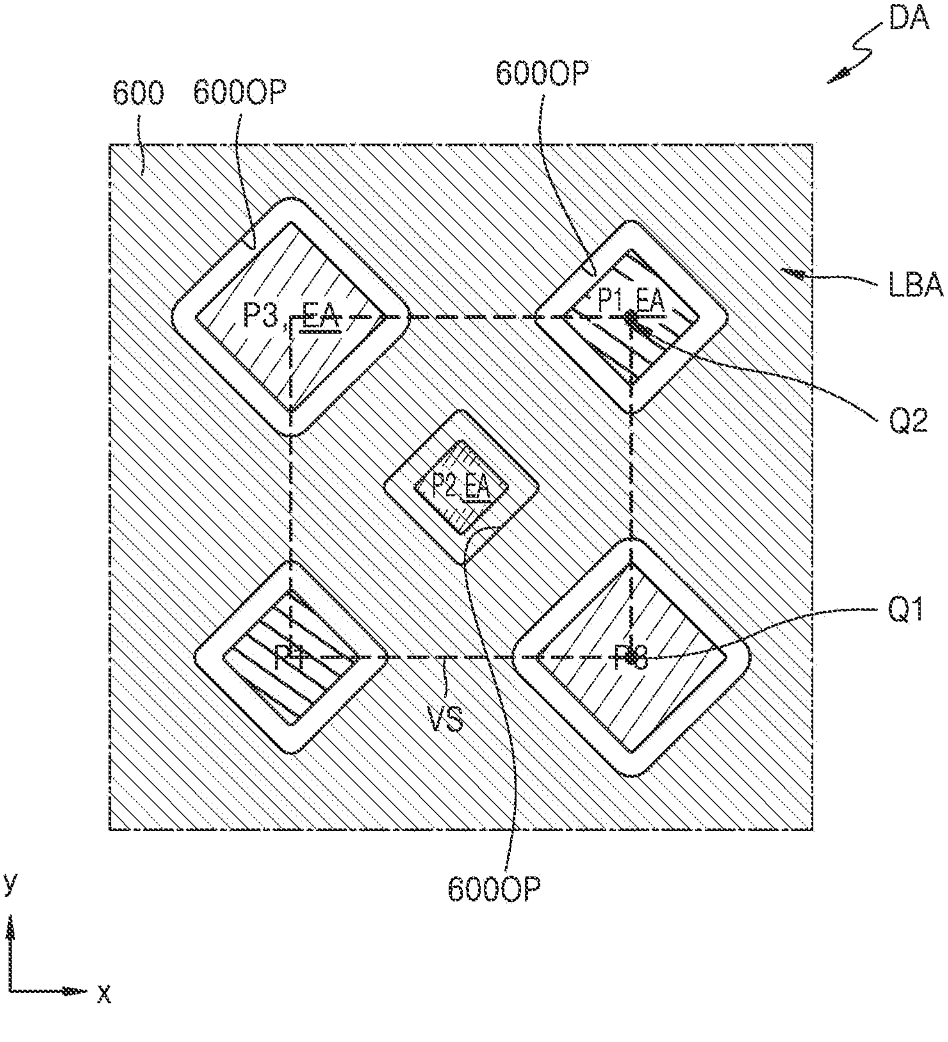
FIGS. 4A and 4B are plan views illustrating a part of a pixel arrangement that may be included in a display area.
Figure 4B:
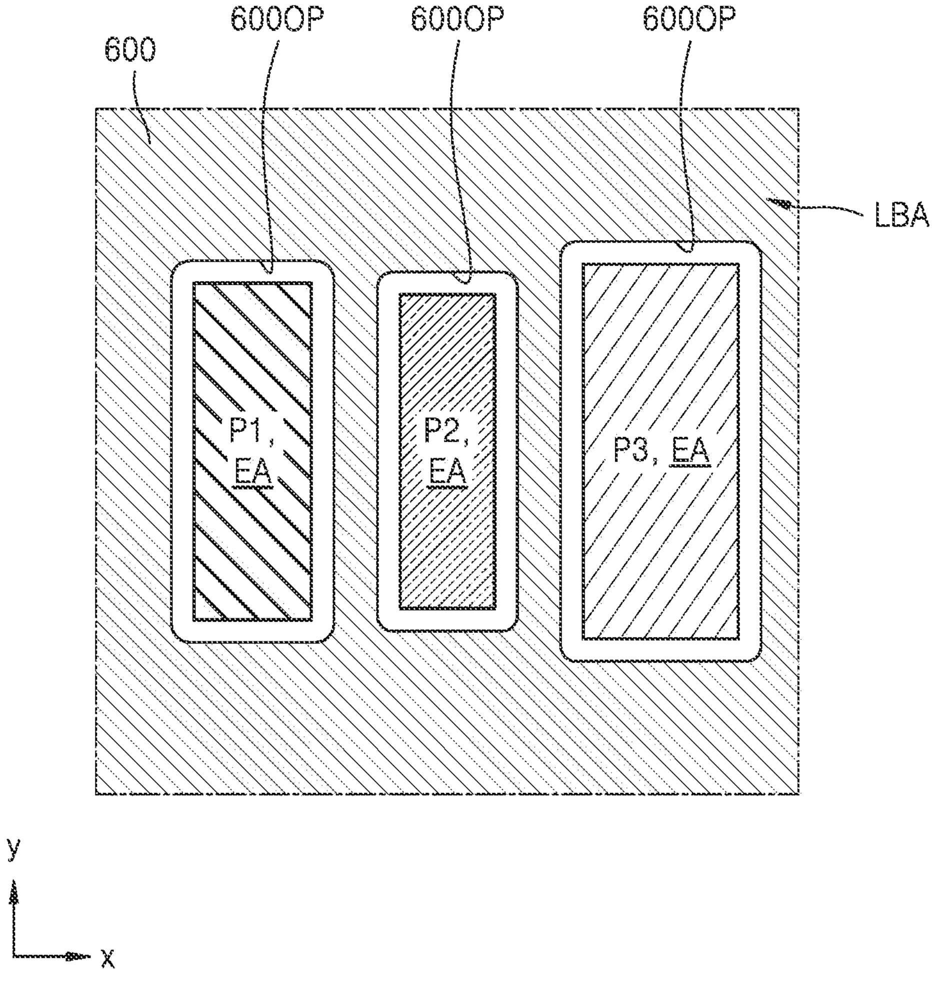

FIGS. 4A and 4B are plan views illustrating a part of a pixel arrangement that may be included in a display area.

Referring to FIG. 4A, a display apparatus may include a plurality of pixels, and the plurality of pixels may include a first pixel P1, a second pixel P2, and a third pixel P3 that respectively emit light of different colors. For example, the first pixel P1 may emit red light, the second pixel P2 may emit green light, and the third pixel P3 may emit blue light. However, the present disclosure is not limited thereto, and various modifications may be made thereto. For example, the first pixel P1 may emit blue light, the second pixel P2 may emit green light, and the third pixel P3 may emit red light.

Each of the first pixel P1, the second pixel P2, and the third pixel P3 may have a quadrangular shape from among polygonal shapes. A polygonal shape or a quadrangular shape may have round vertices. For example, each of the first pixel P1, the second pixel P2, and the third pixel P3 may have a quadrangular shape with round vertices. In another embodiment, each of the first pixel P1, the second pixel P2, and the third pixel P3 may have a circular shape or an elliptical shape.

Sizes of the first pixel P1, the second pixel P2, and the third pixel P3 may be different from one another. For example, the area of the second pixel P2 may be less than the area of each of the first pixel P1 and the third pixel P3, and the area of the first pixel P1 may be greater than the area of the third pixel P3. However, the present disclosure is not limited thereto, and various modifications may be made thereto. For example, sizes of the first pixel P1, the second pixel P2, and the third pixel P3 may be substantially the same.

Figure 5A:
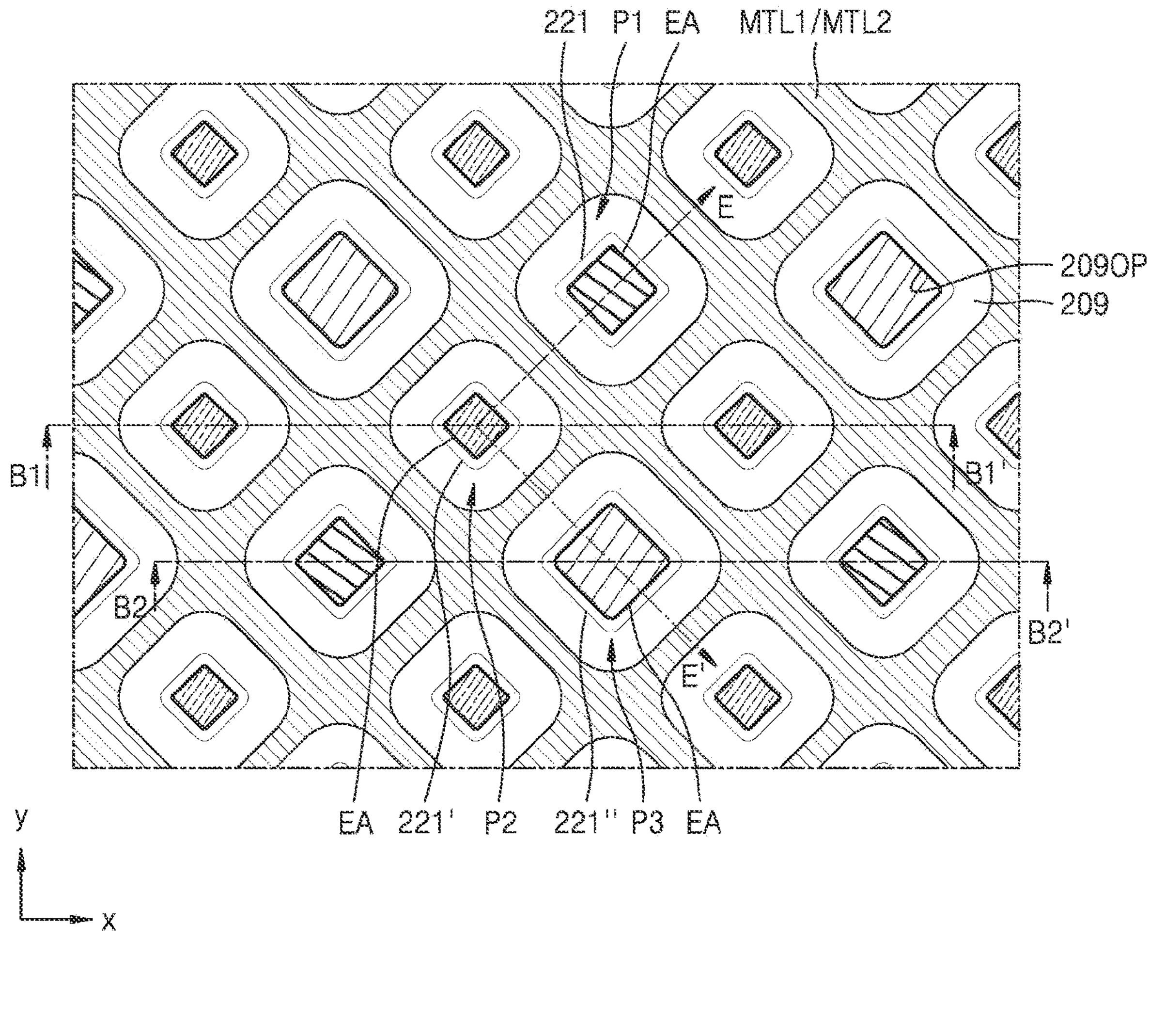
FIG. 5A is a plan view illustrating a part of a display apparatus, according to an embodiment.

In the specification, a size of each of the first pixel P1, the second pixel P2, and the third pixel P3 may refer to a size of an emission area EA of a display element of each pixel, and the emission area EA may be defined by an opening 209OP in a pixel-defining film 209 (see, e.g., FIG. 5A).

A part (or portion) of the anti-reflection layer 600 located on the display layer 200 may be provided as a light-blocking area LBA. According to an embodiment, the light-blocking area LBA may be an area where a color filter layer 610 and a reflection control layer 620, described in more detail below with reference to FIG. 8, overlap each other. The light-blocking area LBA may absorb external light, thereby improving the visibility of the display apparatus 1.

The light-blocking area LBA may have an open portion (e.g., an opening) 600OP corresponding to each pixel. The open portion 600OP is an area obtained by removing a part of the color filter layer 610 or removing a part of the reflection control layer 620, and light emitted by a display element may be emitted to the outside through the open portion 600OP.

In a plan view, the open portion 600OP in the light-blocking area LBA may be located to correspond to each of the first through third pixels P1, P2, and P3. In an embodiment, the open portion 600OP in the light-blocking area LBA may be provided in a quadrangular shape with round corners. The area of each open portion 600OP in the light-blocking area LBA corresponding to each of the first through third pixels P1, P2, and P3 may be greater than the area of each of the first through third pixels P1, P2, and P3. However, the present disclosure is not limited thereto. The area of each open portion 600OP in the light-blocking area LBA may be substantially the same as the area of each of the first through third pixels P1, P2, and P3.

The first pixel P1, the second pixel P2, and the third pixel P3 may be arranged in a diamond structure (or arrangement) (e.g., Pentile® structure) (Pentile® is a registered trademark of Samsung Display Co., Ltd., Republic of Korea). For example, the pixel P1 may be located at a first vertex Q1 of a virtual quadrangle VS having a central point CP of the second pixel P2,which is a central point of the virtual quadrangle VS, and the third pixel P3 may be located at a second vertex Q2 of the virtual quadrangle VS. The virtual quadrangle VS may be a square.

The first pixel P1 may be spaced apart from the second pixel P2, and a central point may be located at the first vertex Q1 of the virtual quadrangle VS. A plurality of first pixels P1 may be provided, and the plurality of first pixels P1 may be spaced apart from each other with the second pixel P2 therebetween.

The third pixel P3 may be spaced apart from the first pixel P1 and the second pixel P2, and a central point may be located at the second vertex Q2 adjacent to the first vertex Q1 of the virtual quadrangle VS. A plurality of third pixels P3 may be provided, and the plurality of third pixels P3 may be spaced apart from each other with the first pixel P1 therebetween.

The plurality of first pixels P1 and the plurality of third pixels P3 may be alternately arranged in an x direction and a y direction crossing (e.g., intersecting) the x direction. The first pixel P1 may be surrounded by (e.g., surrounded in a plan view by) the plurality of second pixels P2 and the plurality of third pixels P3.

Although the first pixel P1, the second pixel P2, and the third pixel P3 are arranged in a Pentile® structure in FIG. 4A, the present disclosure is not limited thereto.

For example, the first pixel P1, the second pixel P2, and the third pixel P3 may be arranged in a stripe structure (or arrangement) as shown in FIG. 4B. For example, the first pixel P1, the second pixel P2, and the third pixel P3 may be sequentially arranged in the x direction. In another embodiment, the first pixel P1, the second pixel P2, and the third pixel P3 may be arranged in any of various pixel arrangement structures, such as a mosaic structure or a delta structure. The display apparatus according to the illustrated embodiment may include the first pixel P1, the second pixel P2, and the third pixel P3 emitting light of different colors, and the light-blocking area LBA may have the open portion 600OP corresponding to each of the first through third pixels P1, P2, and P3.

Hereinafter, a display apparatus according to an embodiment will be described in detail according to a stacking order shown in, for example, FIG. 5A.

Figure 5B:
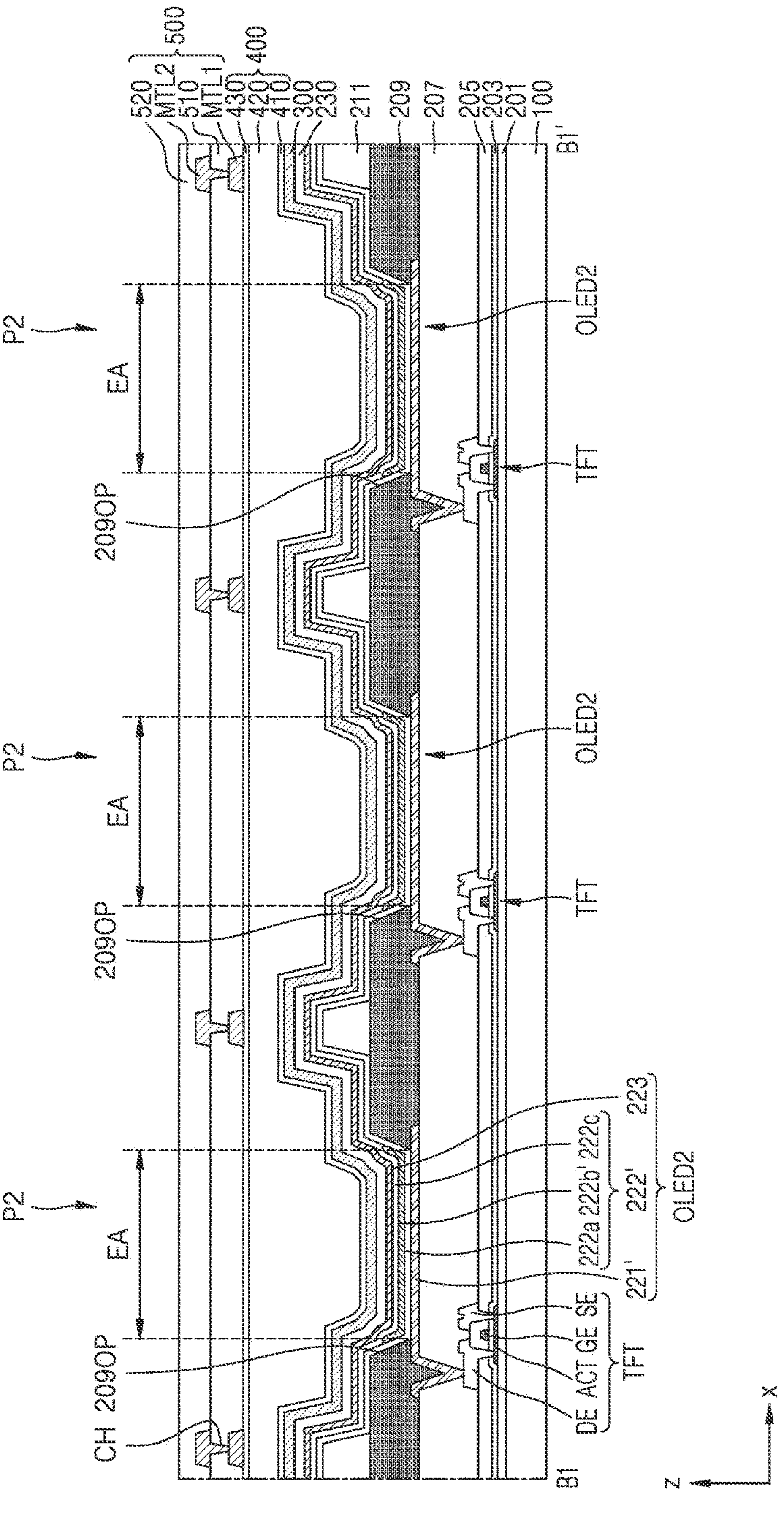
FIG. 5B is a cross-sectional view taken along the line B1-B1' of FIG. 5A.
Figure 5C:
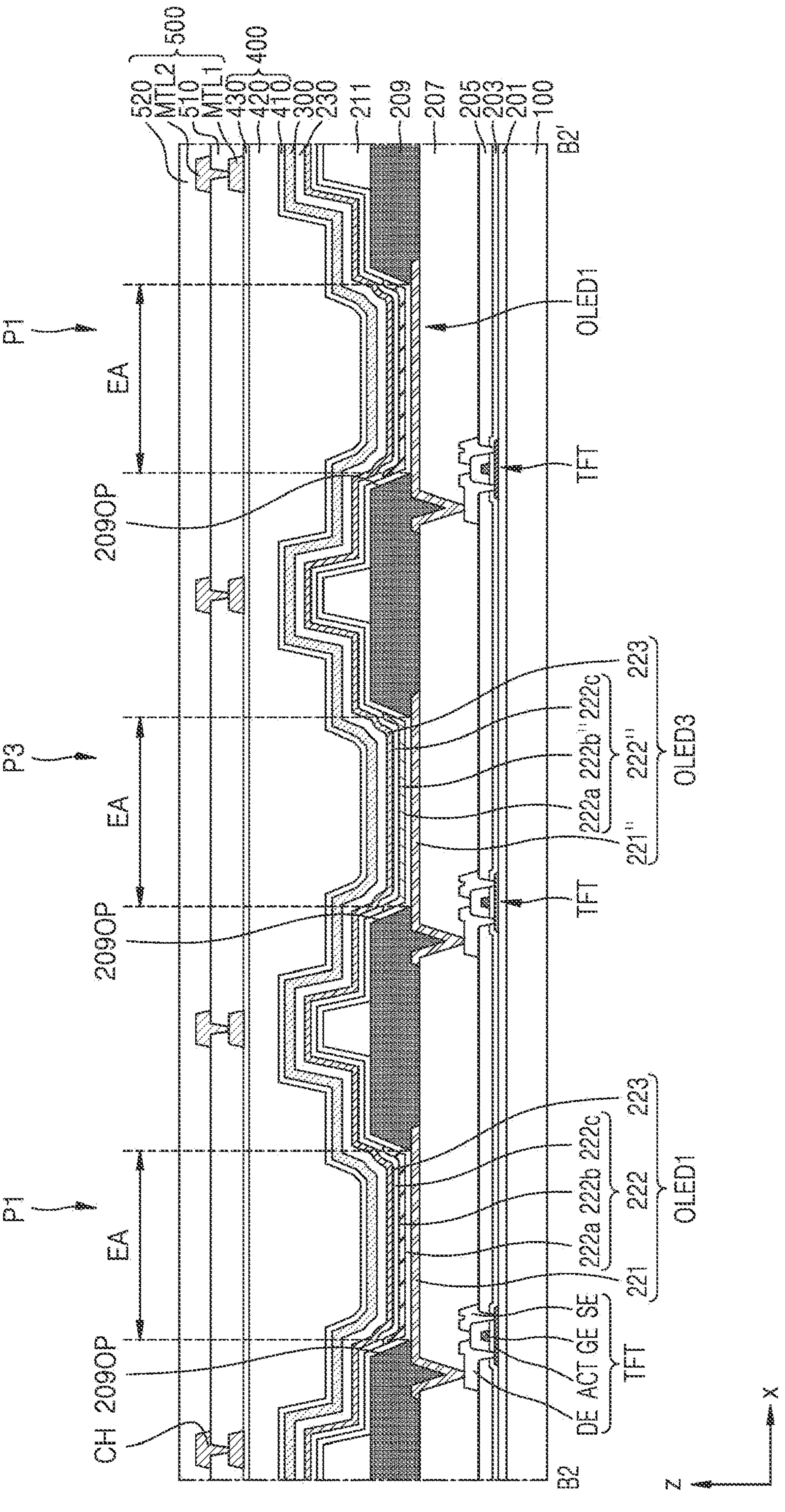
FIG. 5C is a cross-sectional view taken along the line B2-B2' of FIG. 5A.
Figure 6A:
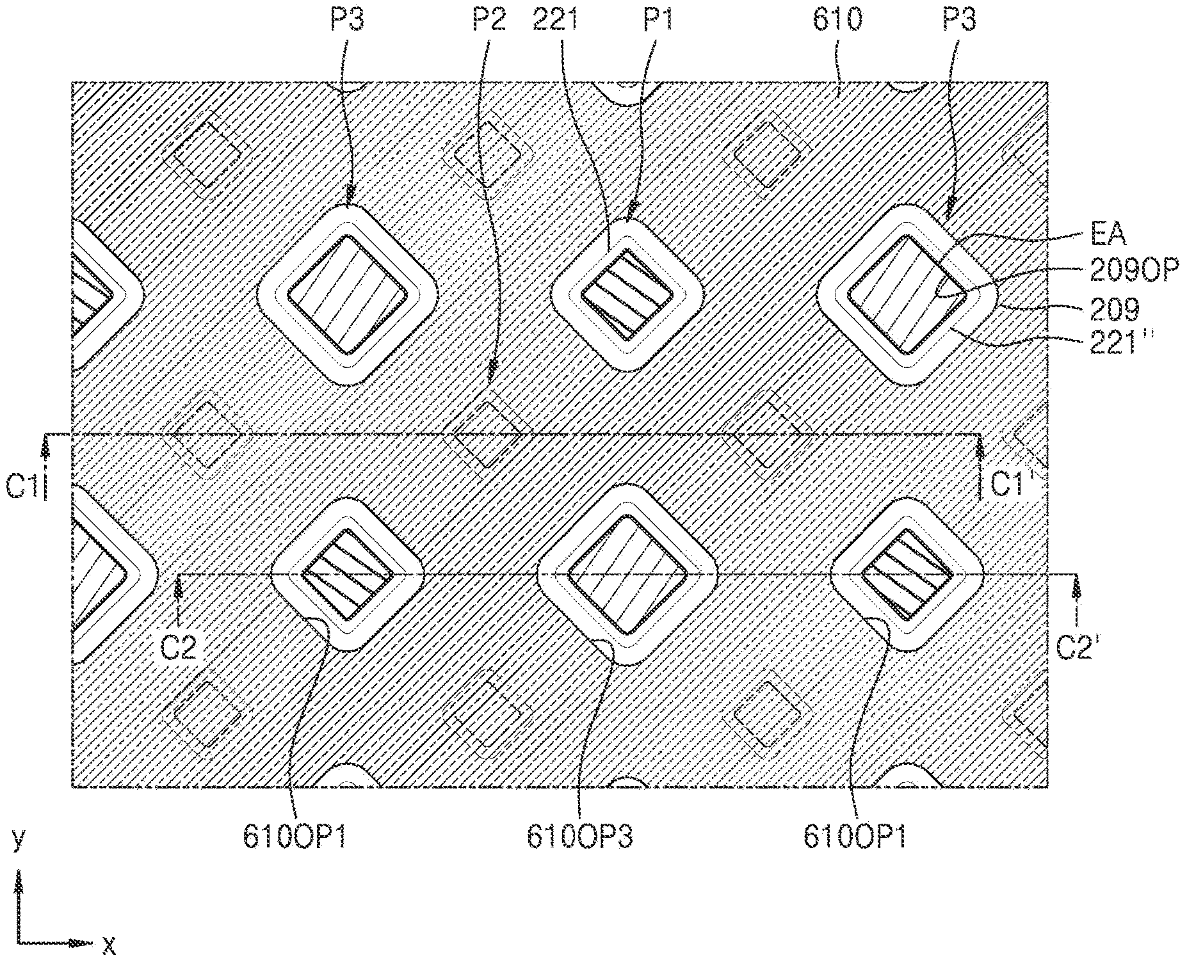
FIG. 6A is a plan view illustrating a part of a display apparatus, according to an embodiment.
Figure 6B:
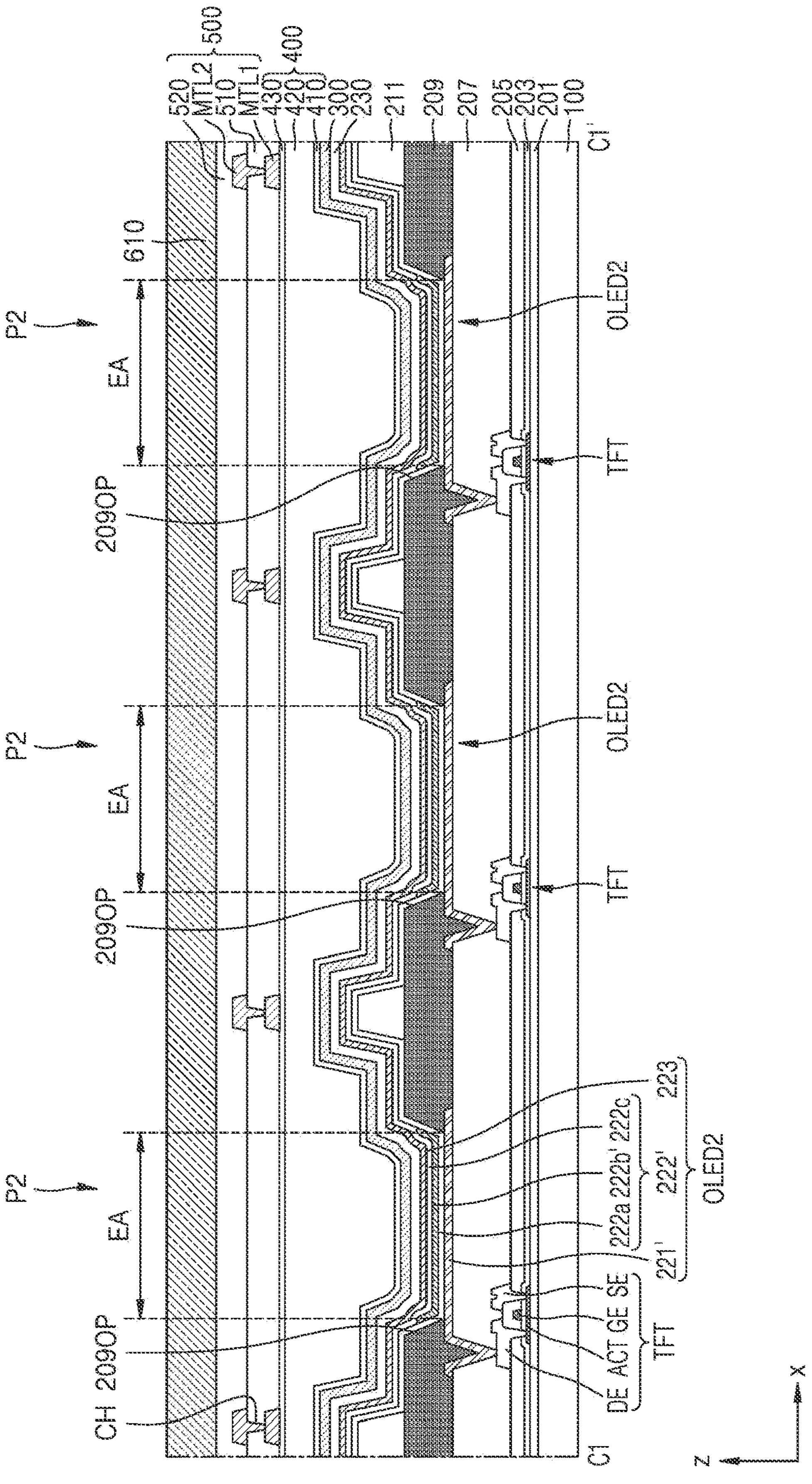
FIG. 6B is a cross-sectional view taken along the line C1-C1' of FIG. 6A.
Figure 6C:
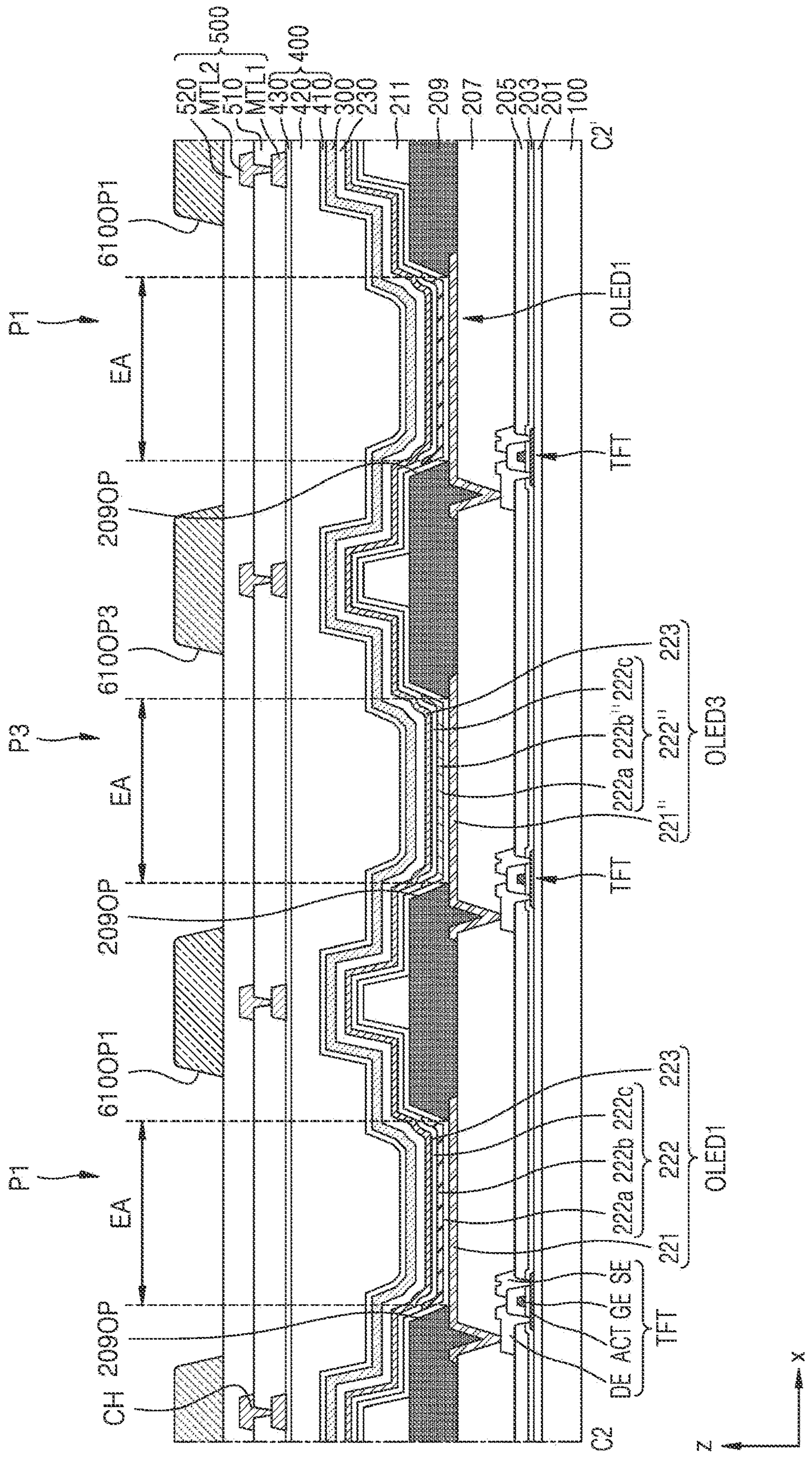
FIG. 6C is a cross-sectional view taken along the line C2-C2' of FIG. 6A.

FIG. 5A is a plan view illustrating a part of a display apparatus, according to an embodiment, FIG. 5B is a cross-sectional view taken along the line B1-B1' of FIG. 5A, and FIG. 5C is a cross-sectional view taken along the line B2-B2' of FIG. 5A. Also, FIG. 6A is a plan view illustrating a part of a display apparatus, according to an embodiment, FIG. 6B is a cross-sectional view taken along the line C1-C1' of FIG. 6A, and FIG. 6C is a cross-sectional view taken along the line C2-C2' of FIG. 6A. Also, FIG. 7A is a plan view illustrating a part of a display apparatus, according to an embodiment, FIG. 7B is a cross-sectional view taken along the line D1-D1' of FIG. 7A, and FIG. 7C is a cross-sectional view taken along the line D2-D2' of FIG. 7A.

FIGS. 5A through 5C and FIGS. 6A through 6C illustrate a part of a process of manufacturing a display apparatus, according to an embodiment. For example, FIGS. 5A through 5C illustrate a structure in which the display layer 200, the low-reflection layer 300, the thin-film encapsulation layer 400, and the touch sensing layer 500 are sequentially stacked on the substrate 100. Next, FIGS. 6A through 6C illustrate a structure in which the color filter layer 610 is located on the structure shown in FIGS. 5A through 5C. Next, FIGS. 7A through 7C illustrate a structure in which the reflection control layer 620 is located on the structure shown in FIGS. 6A through 6C.

Figure 7A:
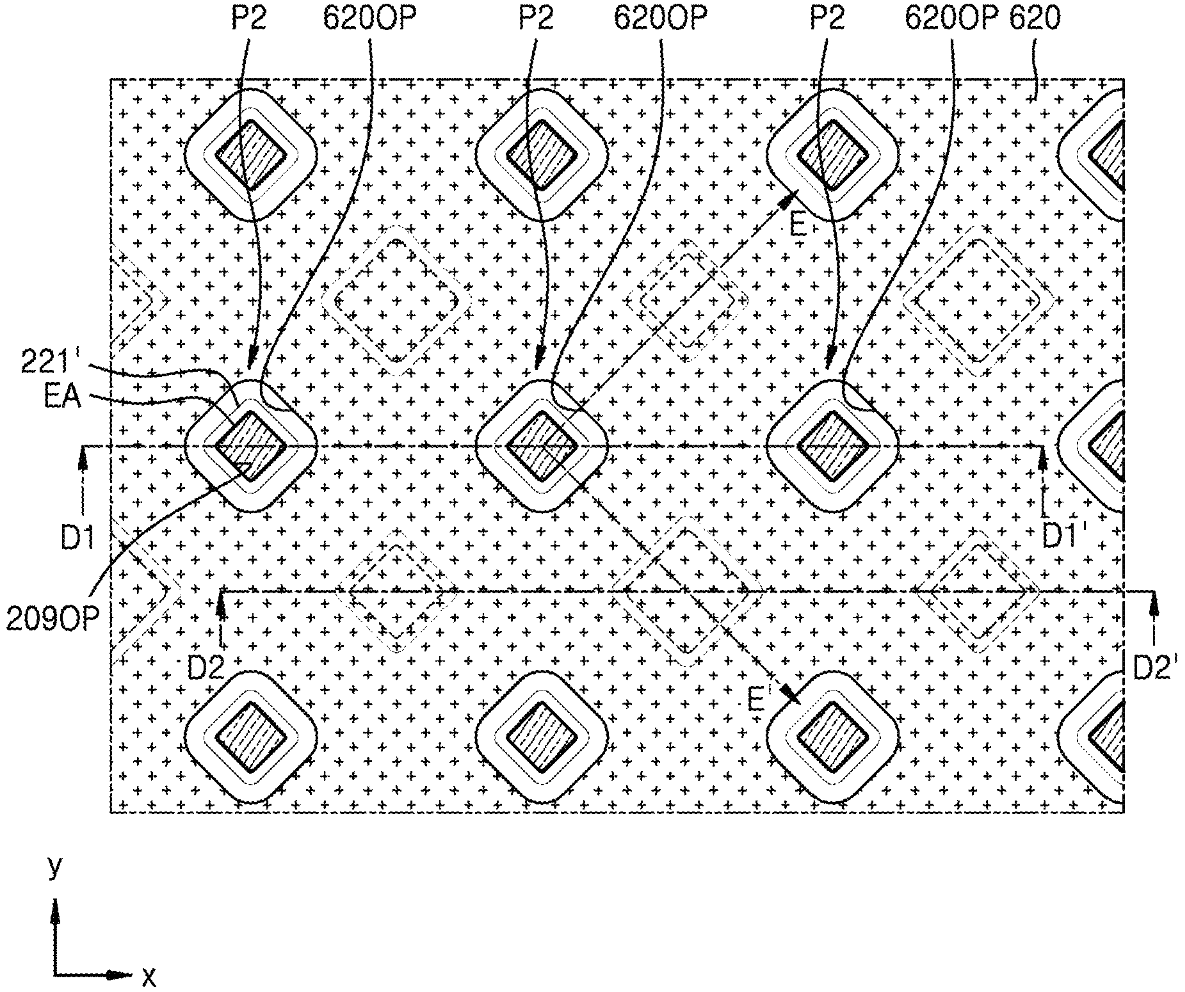
FIG. 7A is a plan view illustrating a part of a display apparatus, according to an embodiment.
Figure 7B:
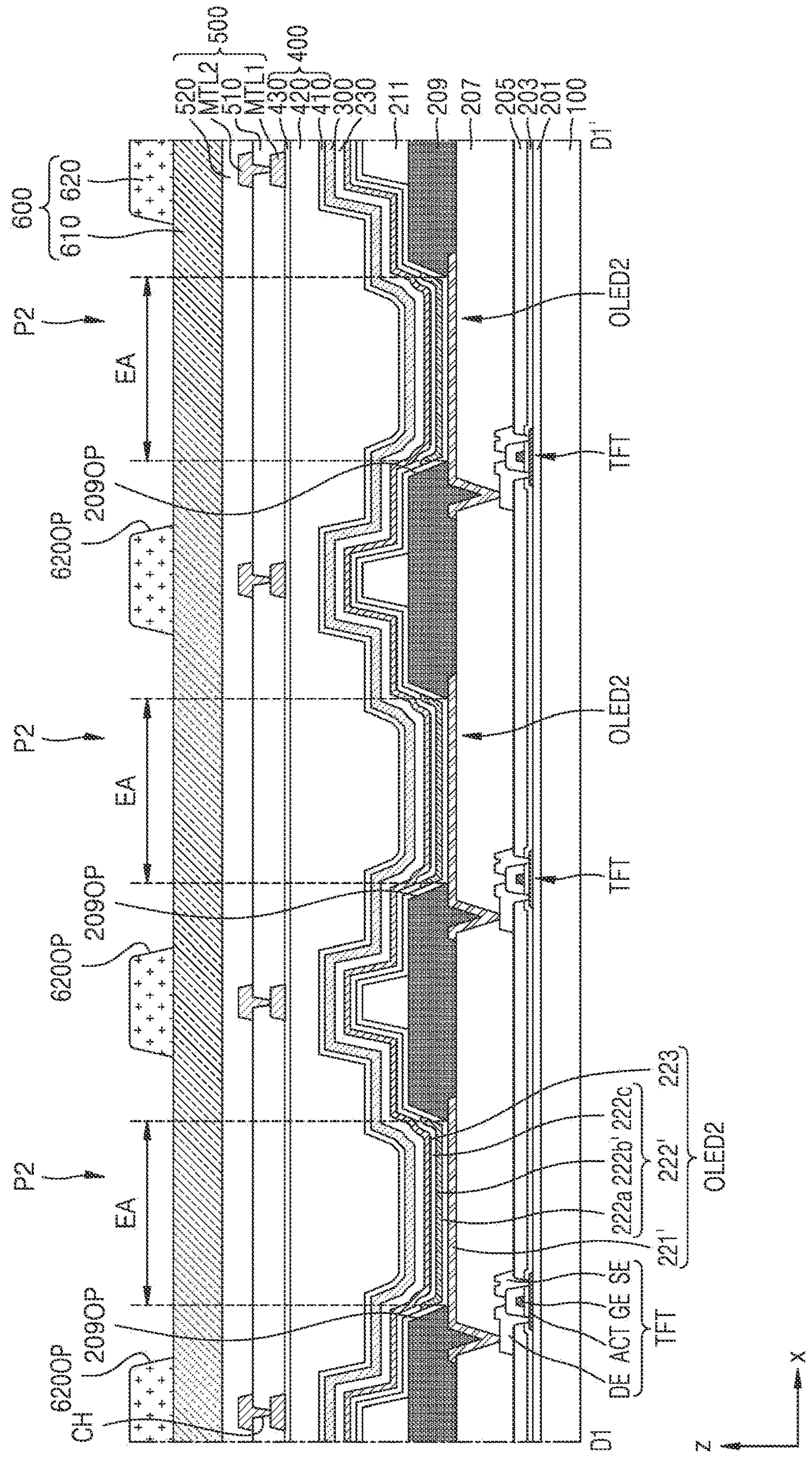
FIG. 7B is a cross-sectional view taken along the line D1-D1' of FIG. 7A.
Figure 7C:
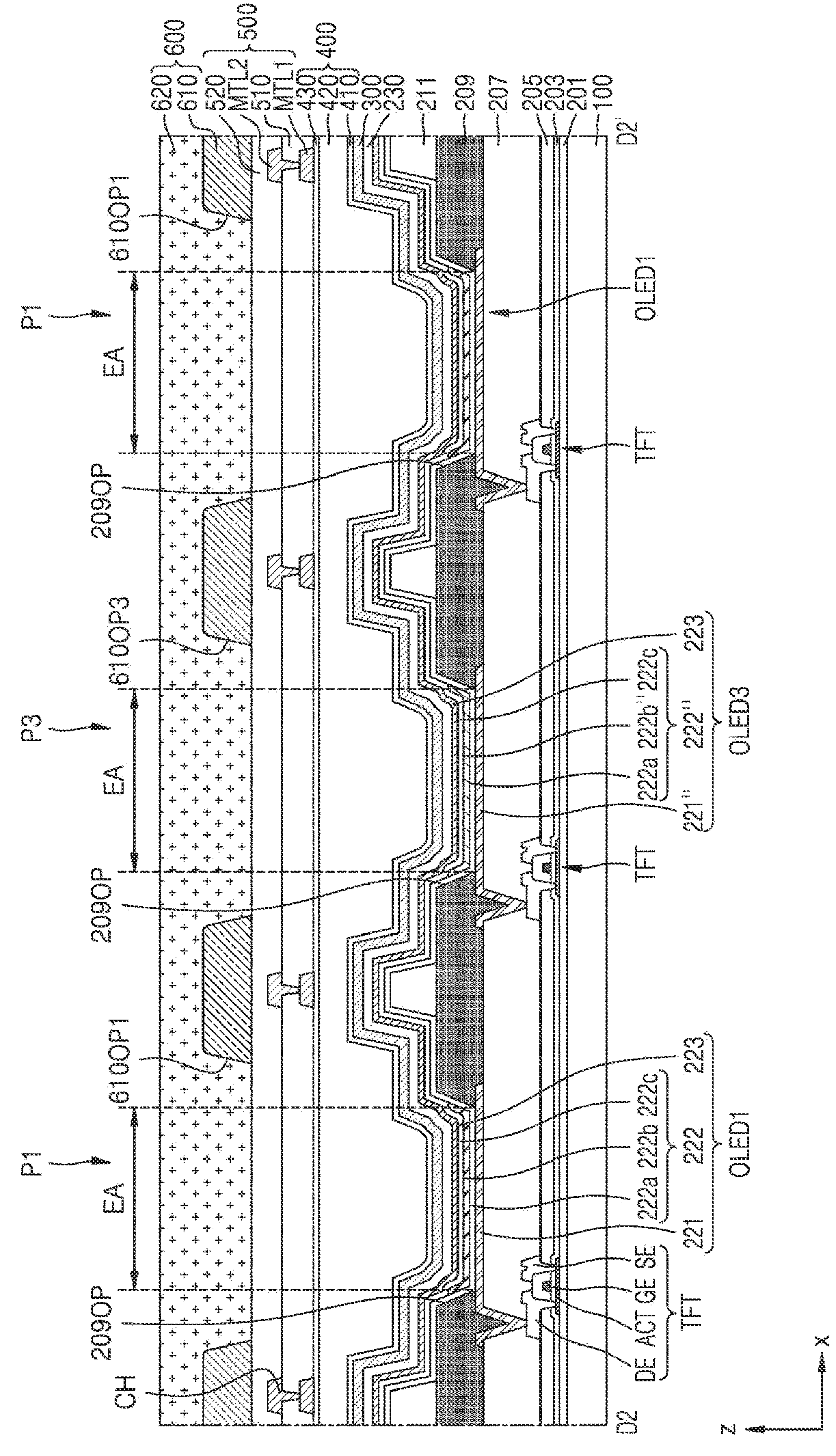
FIG. 7C is a cross-sectional view taken along the line D2-D2' of FIG. 7A.

The line B1-B1' of FIG. 5A, line C1-C1' of FIG. 6A, and line D1-D1' of FIG. 7A may be the same line, and line B2-B2' of FIG. 5A, line C2-C2' of FIG. 6A, and line D2-D2' of FIG. 7A may be the same line. Accordingly, FIGS. 5B, 6B, and 7B illustrate that the second pixels P2 are continuously (e.g., repeatedly) arranged, and FIGS. 5C, 6C, and 7C illustrate that the first pixels P1 and the third pixels P3 are continuously (e.g., repeatedly) arranged.

First, referring to FIGS. 5A through 5C, the display apparatus 1 according to an embodiment may include the substrate 100, the display layer 200, the low-reflection layer 300, the thin-film encapsulation layer 400, and the touch sensing layer 500.

The display layer 200 may include an organic light-emitting diode OLED and a thin-film transistor TFT and may include a buffer layer 201, a gate insulating layer 203, an interlayer insulating layer 205, a planarization layer 207, the pixel-defining film 209, and a spacer 211, which are insulating layers. In an embodiment, the display layer 200 may further include a capping layer 230 located on the organic light-emitting diode OLED.

The buffer layer 201 may be located on the substrate 100 and may reduce or prevent penetration of a foreign material, moisture, or external air from the bottom of the substrate 100 and may planarize the substrate 100. The buffer layer 201 may include an inorganic material, such as an oxide or a nitride, an organic material, or a combination of an organic material and an inorganic material, and may have a single or multi-layer structure including an inorganic material and an organic material. A barrier layer may be further provided between the substrate 100 and the buffer layer 201 to prevent penetration of external air. The buffer layer 201 may include silicon oxide ($SiO_2$) or silicon nitride ($SiN_x$).

The thin-film transistor TFT may be located on the buffer layer 201. The thin-film transistor TFT may include a semiconductor layer ACT, a gate electrode GE, a source electrode SE, and a drain electrode DE. The thin-film transistor TFT may be connected to the organic light-emitting diode OLED to drive the organic light-emitting diode OLED.

The semiconductor layer ACT may be located on the buffer layer 201 and may include polysilicon. In other embodiments, the semiconductor layer ACT may include amorphous silicon. In other embodiments, the semiconductor layer ACT may include an oxide of at least one material selected from the group consisting of indium (In), gallium (Ga), tin (Sn), zirconium (Zr), vanadium (V), hafnium (Hf), cadmium (Cd), germanium (Ge), chromium (Cr), titanium (Ti), and zinc (Zn). The semiconductor ACT may include a channel region, and a source region and a drain region each doped with impurities.

The gate electrode GE, the source electrode SE, and the drain electrode DE may be formed of various conductive materials. The gate electrode GE may include at least one of molybdenum, aluminum, copper, and titanium. For example, the gate electrode GE may have a single-layer structure including molybdenum or may have a three-layer structure including a molybdenum layer, an aluminum layer, and a molybdenum layer. Each of the source electrode SE and the drain electrode DE may include at least one material selected from the group consisting of copper, titanium, and aluminum. For example, each of the source electrode SE and the drain electrode DE may have a three-layer structure including a titanium layer, an aluminum layer, and a titanium layer.

The gate insulating layer 203 including an inorganic material, such as silicon oxide, silicon nitride, and/or silicon oxynitride may be located between the semiconductor layer ACT and the gate electrode GE to secure insulation between the semiconductor layer ACT and the gate electrode GE. The interlayer insulating layer 205 including an inorganic material, such as silicon oxide, silicon nitride, and/or silicon oxynitride, may be located on the gate electrode GE. The source electrode SE and the drain electrode DE may be located on the interlayer insulating layer 205. Such an insulating film including an inorganic material may be formed by using a chemical vapor deposition (CVD) or atomic layer deposition (ALD) process. This may also apply to the following embodiments.

The planarization layer 207 may be located on the thin-film transistor TFT. After the planarization layer 207 is formed, chemical mechanical polishing may be performed on a top surface of the planarization layer 207 to provide a flat top surface (e.g., a flat upper surface). The planarization layer 207 may include a general-purpose polymer (e.g., photosensitive polyimide, polyimide, polystyrene (PS), polycarbonate, benzocyclobutene (BCB), hexamethyldisiloxane (HMDSO), polymethylmethacrylate (PMMA), etc.), a polymer derivative having a phenol-based group, an acrylic polymer, an imide-based polymer, an aryl ether-based polymer, an amide-based polymer, a fluorine-based polymer, a p-xylene-based polymer, or a vinyl alcohol-based polymer. Although the planarization layer 207 is illustrated in FIG. 6 as having a single-layer structure, the planarization layer 207 may have a multi-layer structure.

First through third organic light-emitting diodes OLED1, OLED2, and OLED3 may be located on the planarization layer 207. The first organic light-emitting diode OLED1 may include a first pixel electrode 221, a first intermediate layer 222 including a first common layer **222*a*, a first emission layer 222*b*, and a second common layer 222*c*, and a counter electrode 223, the second organic light-emitting diode OLED2 may include a first pixel electrode 221', a second intermediate layer 222' including the first common layer 222*a*, a second emission layer 222*b*', and the second common layer 222*c*, and the counter electrode 223, and the third organic light-emitting diode OLED3 may include a third pixel electrode 221", a third intermediate layer 222" including the first common layer 222*a*, a third emission layer 222*b*", and the second common layer 222*c*, and the counter electrode 223**.

Hereinafter, the first organic light-emitting diode OLED1 included in the first pixel P1 will be primarily described, and a stacked structure of each of the second organic light-emitting diode OLED2 and the third organic light-emitting diode OLED3 is substantially the same as that of the first organic light-emitting diode OLED1, and thus, a repeated description thereof will be omitted.

The first organic light-emitting diode OLED1 may include the first pixel electrode 221 (hereinafter, the pixel electrode 221), the first intermediate layer 222 (hereinafter, the intermediate layer 222), and the counter electrode 223.

The pixel electrode 221 may be located on the planarization layer 207. The pixel electrode 221 may be located for each pixel (e.g., may be individually provided for each pixel). The pixel electrodes 221 respectively corresponding to adjacent pixels may be spaced apart from each other.

The pixel electrode 221 may be a reflective electrode. In such an embodiment, the pixel electrode 221 may include a reflective film including silver (Ag), magnesium (Mg), aluminum (Al), platinum (Pt), palladium (Pd), gold (Au), nickel (Ni), neodymium (Nd), iridium (Ir), chromium (Cr), or a compound thereof, and a transparent or semi-transparent conductive layer formed on the reflective film. The transparent or semi-transparent electrode layer may include at least one material selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). For example, the pixel electrode 221 may have a stacked structure including ITO/Ag/ITO.

The pixel-defining film 209 may be located on the pixel electrode 221. The pixel-defining film 209 may have the opening 209OP through which a central portion of each pixel electrode 221 is exposed. The pixel-defining film 209 may cover an edge of the pixel electrode 221 and may increase a distance between the edge of the pixel electrode 221 and the counter electrode 223, thereby preventing an arc or the like from occurring at the edge of the pixel electrode 221.

The pixel-defining film 209 may include an organic insulating material. In other embodiments, the pixel-defining film 209 may include an inorganic insulating material, such as silicon nitride, silicon oxynitride, or silicon oxide. In other embodiments, the pixel-defining film 209 may include an organic insulating material and an inorganic insulating material. In an embodiment, the pixel-defining film 209 may include a light-blocking material and may be black. The light-blocking material may include carbon black, carbon nanotubes, a resin or paste including a black dye, metal particles, such as nickel, aluminum, molybdenum, or an alloy thereof, metal oxide particles (e.g., chromium oxide), or metal nitride particles (e.g., chromium nitride). When the pixel-defining film 209 includes a light-blocking material, the reflection of external light due to metal structures located under the pixel-defining film 209 may be reduced.

The spacer 211 may be located on the pixel-defining film 209. The spacer 211 may include an organic insulating material, such as polyimide. In other embodiments, the spacer 211 may include an inorganic insulating material, such as silicon nitride ($SiN_X$) or silicon oxide ($SiO_2$), or may include an organic insulating material and an inorganic insulating material.

In an embodiment, the spacer 211 and the pixel-defining film 209 may include the same material. In such an embodiment, the pixel-defining film 209 and the spacer 211 may be formed together in a mask process by using a halftone mask or the like. In other embodiments, the spacer 211 and the pixel-defining film 209 may include different materials.

The intermediate layer 222 may be located on the pixel electrode 221 and the pixel-defining film 209. The intermediate layer 222 may include the first common layer 222*a*, the emission layer 222*b*, and the second common layer 222*c*.

The emission layer 222*b* may be located in the opening 209OP in the pixel-defining film 209. The emission layer 222*b* may include an organic material including a fluorescent or phosphorescent material configured to emit blue light, green light, or red light. The organic material may include a low molecular weight organic material or a high molecular weight organic material. In other embodiments, the emission layer 222*b* may be formed of an inorganic material including quantum dots. For example, quantum dots may refer to crystals of a semiconductor compound and may include any material capable of emitting light having various emission wavelengths according to sizes of the crystals. Quantum dots may include, for example, a group III-VI semiconductor compound, a group II-VI semiconductor compound, a group III-V semiconductor compound, a group III-VI semiconductor compound, a group I-III-VI semiconductor compound, a group IV-VI semiconductor compound, a group IV element or compound, or any combination thereof.

The first common layer 222*a* and the second common layer 222*c* may be respectively located under and over the emission layer 222*b*. The first common layer 222*a* may include, for example, a hole transport layer (HTL) or may include an HTL and a hole injection layer (HIL). The second common layer 222*c* may include, for example, an electron transport layer (ETL) or may include an ETL and an electron injection layer (EIL). In an embodiment, the second common layer 222*c* may be omitted.

The emission layer 222*b* may be located for each pixel (e.g., may be separately provided for each pixel) to correspond to the opening 209OP in the pixel-defining film 209, and each of the first common layer 222*a* and the second common layer 222*c* may be integrally formed to entirely cover the substrate 100. For example, each of the first common layer 222*a* and the second common layer 222*c* may be integrally formed to entirely cover the display area DA of the substrate 100.

The counter electrode 223 may be a cathode, that is an electron injection electrode. The counter electrode 223 may include a conductive material having a low work function. For example, the counter electrode 223 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), ytterbium (Yb), or an alloy thereof. For example, the counter electrode 223 may be formed of AgMg or AgYb. In other embodiments, the counter electrode 223 may further include a layer formed of ITO, IZO, ZnO, or $In_2O_3$ on the (semi)transparent layer described above. Layers from the pixel electrode 221 to the counter electrode 223 may constitute (e.g., form) the organic light-emitting diode OLED.

In an embodiment, the display apparatus 1 may further include the capping layer 230 located on the organic light-emitting diode OLED. The capping layer 230 may improve the luminous efficiency of the light-emitting element OLED due to constructive interference. The capping layer 230 may include, for example, a material having a refractive index of about 1.6 or more with respect to light having a wavelength of about 589 nm.

The capping layer 230 may include an organic capping layer including an organic material, an inorganic capping layer including an inorganic material, or a composite capping layer including an organic material and an inorganic material. For example, the capping layer 230 may include a carbocyclic compound, a heterocyclic compound, an amine group-containing compound, a porphine derivative, a phthalocyanine derivative, a naphthalocyanine derivative, an alkali metal complex, an alkaline earth metal complex, or any combination thereof. Each of the carbocyclic compound, the heterocyclic compound, and the amine group-containing compound may optionally be substituted with a substituent including O, N, S, Se, Si, F, Cl, Br, I, or any combination thereof.

The low-reflection layer 300 may be located on the capping layer 230. Because the capping layer 230 may be located on the light-emitting element OLED, the low-reflection layer 300 may be located on the light-emitting element OLED. The low-reflection layer 300 may include an inorganic material having a low reflectance. In an embodiment, the low-reflection layer 300 may include a metal or a metal oxide. The low-reflection layer 300 may include, for example, ytterbium (Yb), bismuth (Bi), cobalt (Co), molybdenum (Mo), titanium (Ti), zirconium (Zr), aluminum (Al), chromium (Cr), niobium (Nb), platinum (Pt), tungsten (W), indium (In), tin (Sn), iron (Fe), nickel (Ni), tantalum (Ta), manganese (Mn), zinc (Zn), germanium (Ge), silver (Ag), magnesium (Mg), gold (Au), copper (Cu), calcium (Ca), or a combination thereof. Also, the low-reflection layer 300 may include, for example, $SiO_2$, $TiO_2$, $ZrO_2$, $Ta_2O_5$, $HfO_2$, $Al_2O_3$, ZnO, $Y_2O_3$, BeO, MgO, $PbO_2$, $WO_3$, $SiN_X$, LiF, $CaF_2$, $MgF_2$, CdS, or a combination thereof.

In an embodiment, an absorption coefficient k of the inorganic material included in the low-reflection layer 300 may be equal to or less than about 4.0 ($0<k\leq4.0$) and may be, in some embodiments, equal to or greater than about 0.5 and equal to or less than about 4.0 ($0.5\leq k\leq4.0$). Also, a refractive index n of the inorganic material included in the low-reflection layer 300 may be equal to or greater than about 1 ($n\geq1.0$).

The low-reflection layer 300 may reduce the reflectance of external light by inducing destructive interference between light incident into the display apparatus 1 and light reflected from a metal under the low-reflection layer 300. Accordingly, the display quality and visibility of the display apparatus 1 may be improved by reducing the reflectance of external light through the low-reflection layer 300.

Although the low-reflection layer 300 is entirely located over the substrate 100, similar to the counter electrode 223 and the capping layer 230 as shown in, for example, FIGS. 5B and 5C, the present disclosure is not limited thereto. In another embodiment, the low-reflection layer 300 may be patterned for each pixel.

The thin-film encapsulation layer 400 may be located on the low-reflection layer 300. The thin-film encapsulation layer 400 may include at least one inorganic layer and at least one organic layer. For example, the thin-film encapsulation layer 400 may include a first inorganic encapsulation layer 410, an organic encapsulation layer 420, and a second inorganic encapsulation layer 430.

Each of the first inorganic encapsulation layer 410 and the second inorganic encapsulation layer 430 may include an inorganic insulating material, such as silicon oxide ($SiO_2$), silicon nitride ($SiN_X$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO). Each of the first inorganic encapsulation layer 410 and the second inorganic encapsulation layer 430 may have a single or multi-layer structure including the above inorganic insulating material.

The organic encapsulation layer 420 may relieve internal stress of the first inorganic encapsulation layer 410 and/or the second inorganic encapsulation layer 430. The organic encapsulation layer 420 may include a polymer-based material. The polymer-based material may include polyethylene terephthalate, polyethylene naphthalate, polycarbonate, polyimide, polyethylene sulfonate, polyoxymethylene, polyarylate, hexamethyldisiloxane, acrylic resin (e.g., polymethyl methacrylate, polyacrylic acid, etc.), or any combination thereof.

The organic encapsulation layer 420 may be formed by applying a flowable material including monomers and then reacting the monomers so that the monomers are bonded to form a polymer by using heat or light, such as ultraviolet light. In other embodiments, the organic encapsulation layer 420 may be formed by applying a polymer material.

Even when cracks occur in the thin-film encapsulation layer 400, the cracks may not be connected between (e.g., may not extend between) the first inorganic encapsulation layer 410 and the organic encapsulation layer 420 or between the organic encapsulation layer 420 and the second inorganic encapsulation layer 430 due to the multi-layer structure. Accordingly, the formation of a path through which external moisture or oxygen penetrates into the display area DA may be reduced, minimized, or prevented.

In an embodiment, when the thin-film encapsulation layer 400 is located on the organic light-emitting diode OLED, the substrate 100 may be formed of a polymer resin. However, the present disclosure is not limited thereto.

The touch sensing layer 500 may be located on the thin-film encapsulation layer 400. The touch sensing layer 500 may include a first conductive layer MTL1, a first touch insulating layer 510, a second conductive layer MTL2, and a second touch insulating layer 520.

The first conductive layer MTL1 may be located directly on the thin-film encapsulation layer 400. The first conductive layer MTL1 may be located directly on the second inorganic encapsulation layer 430 of the thin-film encapsulation layer 400. However, the present disclosure is not limited thereto. An insulating layer may be additionally provided between the second inorganic encapsulation layer 430 and the first conductive layer MTL1. In such an embodiment, the insulating layer may include an inorganic insulating material, such as silicon oxide ($SiO_2$), silicon nitride ($SiN_X$), or silicon oxynitride (SiON). In other embodiments, the insulating layer may include an organic insulating material.

In an embodiment, the first touch insulating layer 510 may be located on the first conductive layer MTL1. The first touch insulating layer 510 may include an inorganic material or an organic material. When the first touch insulating layer 510 includes an inorganic material, the first touch insulating layer 510 may include at least one material selected from the group consisting of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride. When the first touch insulating layer 510 includes an organic material, the first touch insulating layer 510 may include at least one material selected from the group consisting of an acrylic resin, a methacrylic resin, polyisoprene, a vinyl-based resin, an epoxy-based resin, a urethane-based resin, a cellulose-based resin, and a perylene-based resin.

In an embodiment, the second conductive layer MTL2 may be located on the first touch insulating layer 510. The second conductive layer MTL2 may act as a sensor for sensing a touch input of a user. The first conductive layer MTL1 may act as a connector for connecting the patterned second conductive layer MTL2 in one direction. In an embodiment, both the first conductive layer MTL1 and the second conductive layer MTL2 may act as sensors. In such an embodiment, the first conductive layer MTL1 and the second conductive layer MTL2 may be electrically connected to each other through a contact opening (e.g., a contact hole) CH. Because both the first conductive layer MTL1 and the second conductive layer MTL2 act as sensors, the resistance of a touch electrode may be reduced and a user touch input may be rapidly sensed.

In an embodiment, each of the first conductive layer MTL1 and the second conductive layer MTL2 may have a mesh structure as shown in, for example, FIG. 5A so that light emitted from the organic light-emitting diode OLED passes through the first conductive layer MTL1 and the second conductive layer MTL2. In this case, the first conductive layer MTL1 and the second conductive layer MTL2 may be arranged not to overlap the emission area EA of the organic light-emitting diode OLED.

Each of the first conductive layer MTL1 and the second conductive layer MTL2 may include a metal layer or a transparent conductive layer. The metal layer may include molybdenum (Mo), silver (Ag), titanium (Ti), copper (Cu), aluminum (Al), or an alloy thereof. The transparent conductive layer may include a transparent conductive oxide, such as indium tin oxide (ITO), indium zinc oxide (IZO), zinc oxide (ZnO), or indium tin zinc oxide (ITZO). In addition, the transparent conductive layer may include a conductive polymer, such as poly(3,4-ethylenedioxythiophene) (PEDOT), metal nanowires, carbon nanotubes, or graphene.

In an embodiment, the second touch insulating layer 520 may be located on the second conductive layer MTL2. The second touch insulating layer 520 may include an inorganic material or an organic material. When the second touch insulating layer 520 includes an inorganic material, the second touch insulating layer 520 may include at least one material selected from the group consisting of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride. When the second touch insulating layer 520 includes an organic material, the second touch insulating layer 520 may include at least one material selected from the group consisting of an acrylic resin, a methacrylic resin, polyisoprene, a vinyl-based resin, an epoxy-based resin, a urethane-based resin, a cellulose-based resin, and a perylene-based resin.

Next, referring to FIGS. 6A through 6C, the color filter layer 610 may be located on the touch sensing layer 500. The color filter layer 610 may transmit light in a specific wavelength region. For example, the color filter layer 610 may transmit only light in a first wavelength region emitted by the second organic light-emitting diode OLED2. For example, second light may be green light, and the color filter layer 610 may include a green component. The green component may include a green pigment, a green dye, or the like. In an embodiment, the color filter layer 610 may transmit green light emitted from the second organic light-emitting diode OLED2 and may absorb light having a wavelength other than green light, thereby improving the purity of green light. Also, because green light emitted by the second organic light-emitting diode OLED2 passes through the color filter layer 610, a bandwidth of an emission wavelength may be reduced. For example, green light with high color purity may be emitted through the color filter layer 610.

The color filter layer 610 may be entirely located on the touch sensing layer 500 as shown in, for example, FIG. 6A, and may have a first opening 610OP1 and a third opening 610OP3. As shown in FIGS. 6A and 6C, the first opening 610OP1 may correspond to the first organic light-emitting diode OLED1, and the third opening 610OP3 may correspond to the third organic light-emitting diode OLED3. As shown in FIG. 6A, light emitted by the first organic light-emitting diode OLED1 and the third organic light-emitting diode OLED3 viewed in a direction normal to the substrate 100 may be emitted to the outside by passing through the first opening 610OP1 and the third opening 610OP3, respectively. Accordingly, because the first organic light-emitting diode OLED1 and the third organic light-emitting diode OLED3 do not overlap the color filter layer 610, light emitted by the first organic light-emitting diode OLED1 and the third organic light-emitting diode OLED3 may be emitted to the outside without passing through the color filter layer 610. A part of the second touch insulating layer 520 located under the color filter layer 610 may be exposed through the first opening 610OP1 and the third opening 610OP3.

In an embodiment, a width (e.g., a size) of each of the first opening 610OP1 and the third opening 610OP3 may be equal to or greater than that of the emission area EA of each of the first organic light-emitting diode OLED1 and the third organic light-emitting diode OLED3. For example, because the emission area EA of each of the first through third organic light-emitting diodes OLED1, OLED2, and OLED3 is defined through the opening 209OP of the pixel-defining film 209, each of the first opening 610OP1 and the third opening 610OP3 may be equal to or larger than the opening 209OP in the pixel-defining film 209. Accordingly, the emission area EA of each of the first organic light-emitting diode OLED1 and the third organic light-emitting diode OLED3 may not be reduced (e.g., may not be reduced in size) by each of the first opening 610OP1 and the third opening 610OP3.

As shown in FIGS. 6A and 6B, the color filter layer 610 may overlap the second organic light-emitting diode OLED2. For example, the color filter layer 610 may not have an opening corresponding to the second organic light-emitting diode OLED2. Accordingly, light emitted by the second organic light-emitting diode OLED2 may be emitted to the outside by passing through the color filter layer 610.

Next, referring to FIGS. 7A through 7C, the anti-reflection layer 600 including the color filter layer 610 and the reflection control layer 620 may be formed. The reflection control layer 620 may be located on the color filter layer 610.

The reflection control layer 620 may absorb light in a wavelength region of about 480 nm to about 600 nm to have a light transmittance of about 60% or less in the wavelength region, and a light transmittance of 10% or less in a wavelength region of about 530 nm to about 600 nm. A light transmittance of the reflection control layer 620 is shown as a graph in FIG. 11. The reflection control layer 620 may absorb light having a wavelength beyond a red light, green light, or blue light wavelength range of the organic light-emitting diode OLED. Accordingly, the reflection control layer 620 may absorb light having a wavelength not belonging to (other than) the red, green, or blue light wavelength range, thereby reducing or preventing a decrease in a luminance of the display apparatus 1, reducing or preventing a decrease in the luminous efficiency of the display apparatus 1, and improving visibility.

In an embodiment, the reflection control layer 620 may include an organic material layer including a dye, a pigment, or a combination thereof. The reflection control layer 620 may include a tetraazaporphyrin-based compound (e.g., a (TAP)-based compound), a porphyrin-based compound, a metal porphyrin-based compound, an oxazine-based compound, a squarylium-based compound, a triarylmethane-based compound, a polymethine-based compound, an anthraquinone-based compound, a phthalocyanine-based compound, an azo-based compound, a perylene-based compound, a xanthene-based compound, a diammonium-based compound, a dipyrromethene-based compound, a cyanine-based compound, or a combination thereof.

For example, the reflection control layer 620 may include a compound represented by one of Formulae 1 through 4.

Formulae 1 through 4 may be chromophore structures corresponding to some of the above compounds. Formulae 1 through 4 are merely an example, and the present disclosure is not limited thereto.

Formula 1

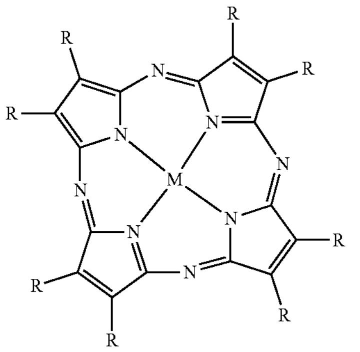

Formula 2

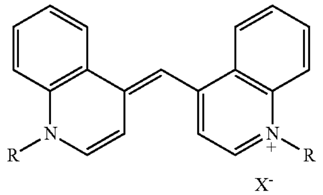

Formula 3

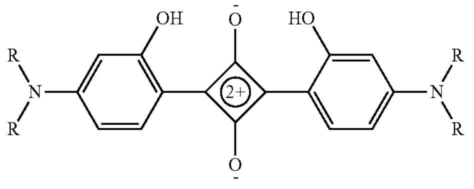

Formula 4

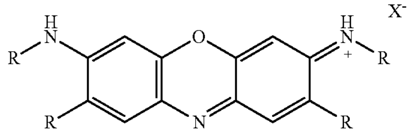

Wherein in Formulae 1 through 4:

M may be a metal,

X— may be a monovalent anion,

R may be equal to or different from each other, and may each include:

hydrogen, deuterium (-D), —F, —CL, —BR, —I, a hydroxyl group, a cyano group, or a nitro group; a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof; and/or a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$).

$Q_1$ to $Q_3$, $Q_{11}$ to $Q_{13}$, $Q_{21}$ to $Q_{23}$, and $Q_{31}$ to $Q_{33}$ may each independently be selected from: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

In an embodiment, X— may be a halide ion, a carboxylate ion, a nitrate ion, a sulfonate ion or a bisulfate ion.

For example, X— may be F—, Cl—, BR—, I—, CH3COO—, NO3-, HSO4-, a propionate ion, a benzene sulfonate ion, or the like.

In an embodiment, a reflectance measured in a specular component included (SCI) mode on a surface of the reflection control layer 620 may be equal to or less than about 10%. For example, the reflection control layer 620 may absorb the reflection of external light of the display apparatus, thereby improving visibility.

The display apparatus according to embodiments of the present disclosure employs the low-reflection layer 300 and the reflection control layer 620 without using a polarizing film to reduce the reflection of external light.

When a polarizing film is used to reduce the reflection of external light, a transmittance of light emitted by the organic light-emitting diode OLED may be greatly reduced due to the polarizing film. When a color filter corresponding to a color of each pixel is used to reduce the reflection of external light, reflective color bands may be produced according to different light reflectances according to pixels, thereby increasing process steps and process costs.

Because the display apparatus according to embodiments of the present disclosure employs the low-reflection layer 300 and the reflection control layer 620, a light transmittance may be increased and the reflection of external light may be reduced.

The reflection control layer 620 may be located on the color filter layer 610 and may have a second opening 620OP corresponding to the second organic light-emitting diode OLED2, as shown in, for example, FIG. 7B. A part of the color filter layer 610 under the reflection control layer 620 may be exposed through the second opening 620OP. As shown in FIG. 7B, light emitted by the second organic light-emitting diode OLED2 viewed in a direction normal to the substrate 100 may be emitted to the outside through the second opening 620OP. Accordingly, because the second organic light-emitting diode OLED2 overlaps the color filter layer 610 but does not overlap the reflection control layer 620, light emitted by the second organic light-emitting diode OLED2 may be emitted to the outside by passing through the color filter layer 610 without passing through the reflection control layer 620. For example, light emitted by the second organic light-emitting diode OLED2 may pass through the color filter layer 610 and may be emitted to the outside through the second opening 620OP in the reflection control layer 620.

In an embodiment, a width (e.g., a size) of the second opening 620OP may be equal to or greater than that of the emission area EA of the second organic light-emitting diode OLED2. For example, because the emission area EA of each of the first through third organic light-emitting diodes OLED1, OLED2, and OLED3 is defined by the opening 209OP in the pixel-defining film 209, the second opening 620OP may be equal to or larger than the opening 209OP in the pixel-defining film 209 to prevent the emission area EA of the second organic light-emitting diode OLED2 from being reduced (e.g., reduced in size) by the second opening 620OP.

As shown in FIGS. 7A and 7C, the reflection control layer 620 may be located on the color filter layer 610 and may fill the first opening 610OP1 and the third opening 610OP3. A part of the reflection control layer 620 may contact the second touch insulating layer 520 through the first opening 610OP1 and the third opening 610OP3. When the reflection control layer 620 fills the first opening 610OP1 and the third opening 610OP3, the reflection control layer 620 may overlap the first organic light-emitting diode OLED1 and the third organic light-emitting diode OLED3. For example, the reflection control layer 620 may not have openings corresponding to the first organic light-emitting diode OLED1 and the third organic light-emitting diode OLED3.

As shown in FIG. 7C, light emitted by the first organic light-emitting diode OLED1 and the third organic light-emitting diode OLED3, viewed in a direction normal to the substrate 100, may be emitted to the outside through the first opening 610OP1 and the third opening 610OP3 in the color filter layer 610. Accordingly, because the first organic light-emitting diode OLED1 and the third organic light-emitting diode OLED3 overlap the color filter layer 610 but do not overlap the reflection control layer 620, light emitted by the first organic light-emitting diode OLED1 and the third organic light-emitting diode OLED3 may be emitted to the outside by passing through the reflection control layer 620 without passing through the color filter layer 610. For example, light emitted by the first organic light-emitting diode OLED1 and the third organic light-emitting diode OLED3 may pass through the first opening 610OP1 and the third opening 610OP3 in the color filter layer 610 and may be emitted to the outside by passing through the reflection control layer 620.

Figure 8:
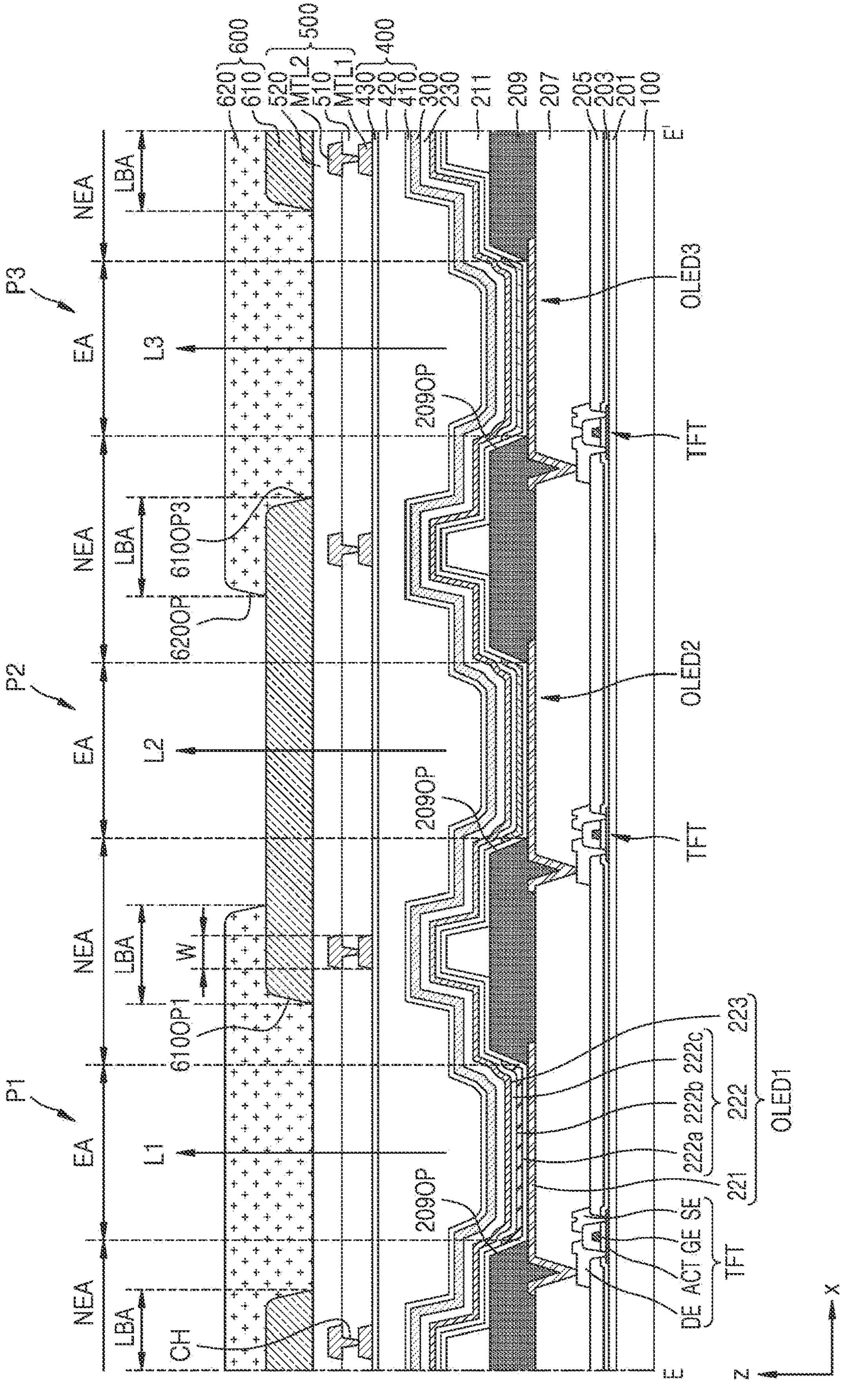
FIG. 8 is a cross-sectional view illustrating a part of a display apparatus, according to an embodiment.

FIG. 8 is a cross-sectional view taken along the line E-E' of FIG. 7A, according to an embodiment.

FIG. 8 is a cross-sectional view illustrating the first organic light-emitting diode OLED1, the second organic light-emitting diode OLED2, and the third organic light-emitting diode OLED3.

Referring to FIG. 8, as described above, the reflection control layer 620 may be located to correspond to the first organic light-emitting diode OLED1 and the third organic light-emitting diode OLED3, and the color filter layer 610 may be located to correspond to the second organic light-emitting diode OLED2.

Referring to FIG. 8, first color light L1 (e.g., red light) emitted by the first organic light-emitting diode OLED1 may pass through the first opening 610OP1 in the color filter layer 610 and may be emitted to the outside by passing through the reflection control layer 620. Second color light L2 (e.g., green light) emitted by the second organic light-emitting diode OLED2 may pass through the color filter layer 610 and may be emitted to the outside by passing through the second opening 620OP in the reflection control layer 620. And third color light L3 (e.g., blue light) emitted by the third organic light-emitting diode OLED3 may pass through the third opening 610OP3 in the color filter layer 610 and may be emitted to the outside by passing through the reflection control layer 620.

The non-emission area NEA may be provided between the emission areas EA of the first through third organic light-emitting diodes OLED1, OLED2, and OLED3. In an embodiment, the anti-reflection layer 600 may be located to correspond to the non-emission area NEA. The anti-reflection layer 600 corresponding to the non-emission area NEA may include both the color filter layer 610 and the reflection control layer 620. For example, the color filter layer 610 and the reflection control layer 620 may overlap each other in the non-emission area NEA. A portion of the non-emission area NEA at where the color filter layer 610 and the reflection control layer 620 overlap each other may be defined as the light-blocking area LBA.

Because the light-blocking area LBA includes two layers, that is, the color filter layer 610 and the reflection control layer 620, provided therein and each layer respectively blocks light corresponding to a specific wavelength, the reflection of external light by, for example, metal structures located under the light-blocking area LBA may be reduced. In an embodiment, a width of the light-blocking area LBA may be greater than a width w of the first conductive layer MTL1 and/or the second conductive layer MTL2.

Figure 10:
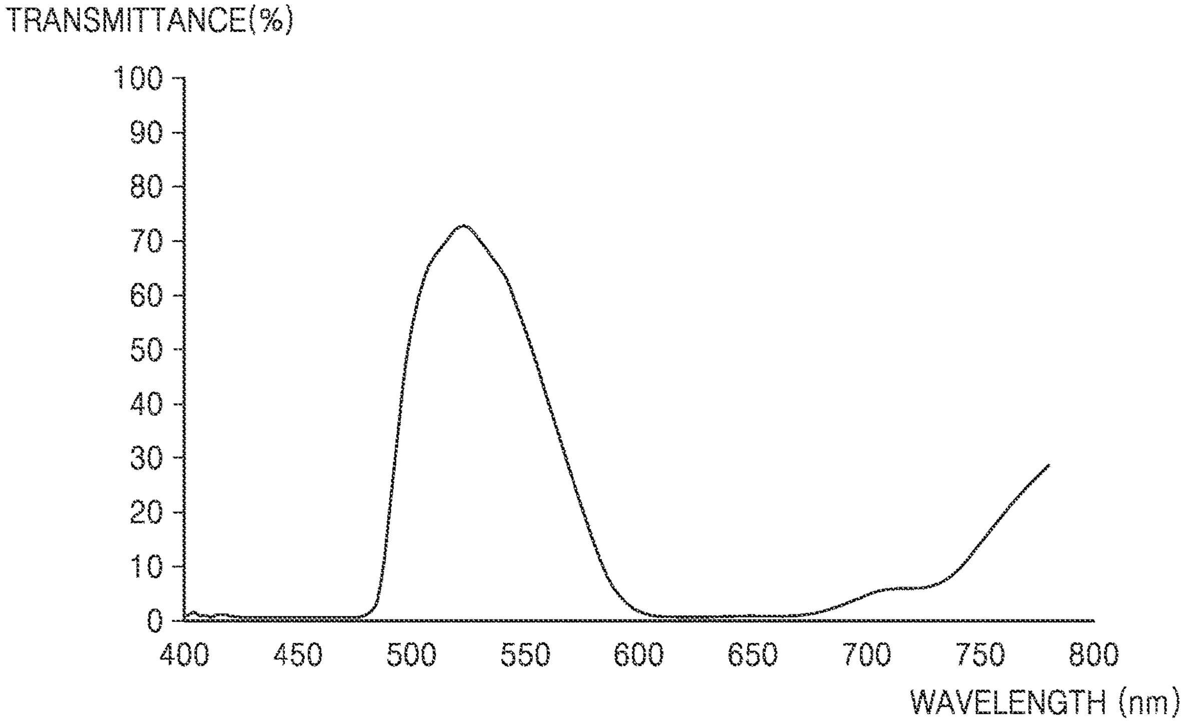
FIG. 10 is a graph showing a transmittance for each wavelength of a color filter layer according to an embodiment.
Figure 11:
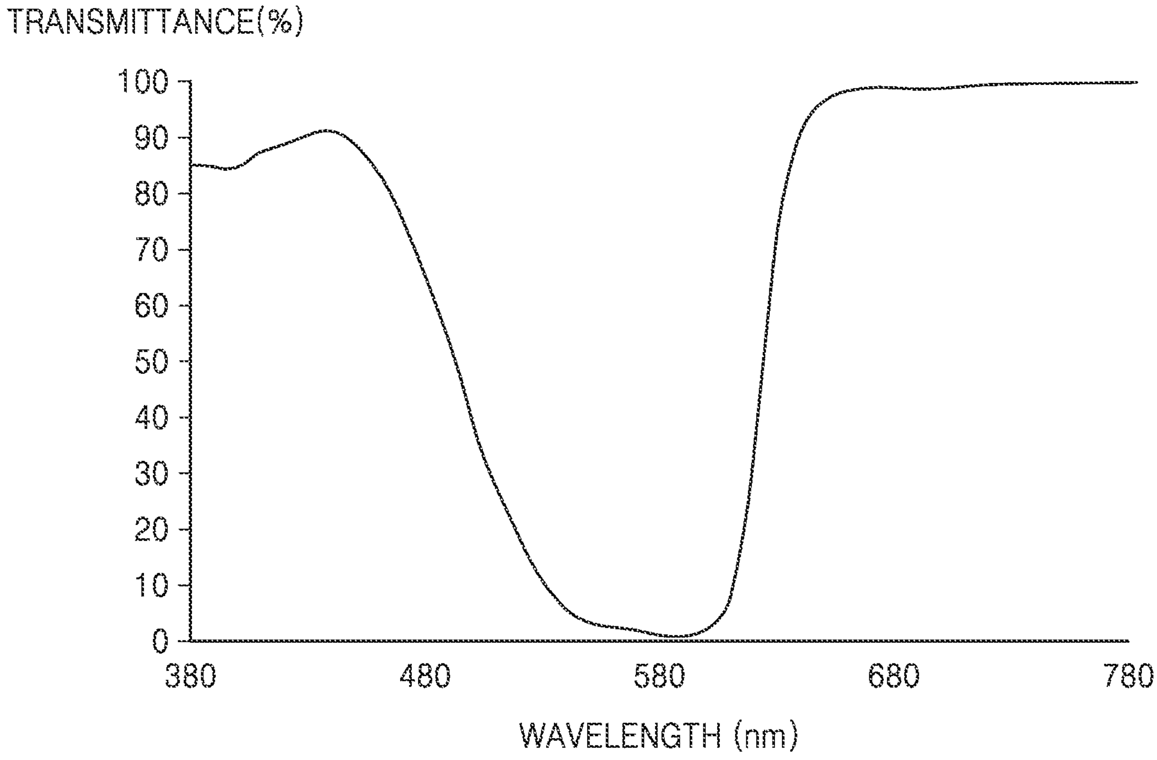
FIG. 11 is a graph showing a transmittance for each wavelength of a reflection control layer according to an embodiment.
Figure 12:
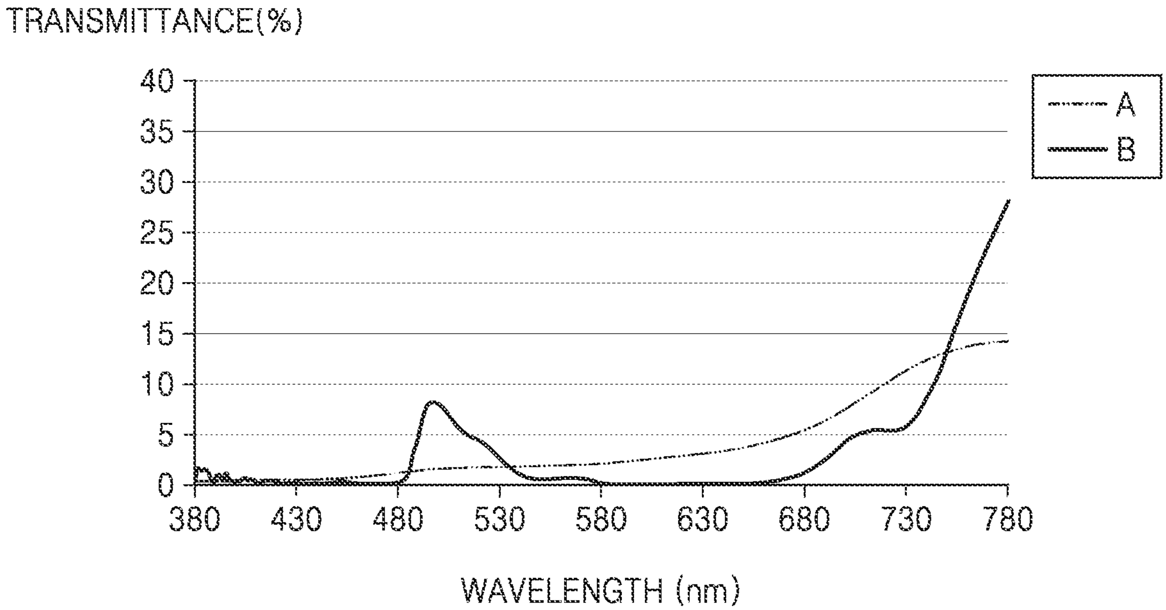
FIG. 12 is a graph showing a transmittance for each wavelength of a light-blocking area of an anti-reflection layer in FIG. 11 and a comparative example.

FIG. 9 is a table showing optical densities of a light-blocking area of an anti-reflection layer according to an embodiment and a comparative example. FIG. 10 is a graph showing a transmittance for each wavelength of a color filter layer according to an embodiment. FIG. 11 is a graph illustrating a transmittance for each wavelength of a reflection control layer according to an embodiment. FIG. 12 is a graph showing a transmittance for each wavelength of a light-blocking area of an anti-reflection layer of FIG. 11 and a comparative example.

Referring to FIG. 9, row "A" corresponds to a comparative example and shows an optical density (OD) of a black matrix, and row "B" corresponds to an embodiment of the present disclosure and shows an OD of the light-blocking area LBA of the anti-reflection layer 600. As OD increases, light transmittance decreases.

First, the black matrix may include a light-blocking material and may be substantially black. Because the display apparatus according to an embodiment includes a two-layer structure including the color filter layer 610 and the reflection control layer 620, without including a black matrix, to form the light-blocking area LBA, the number of masks in a process may be reduced and a manufacturing process may be simplified.

The black matrix may be selected in consideration of characteristics and material processability of a display panel, and an OD of the black matrix may be in a range from about 0.8 to about 2.5 per 1 μm in thickness. A thickness of the black matrix may be in a range from about 1 μm to about 2 μm according to process needs, and in this case, an OD of the black matrix may range from 0.8 to 4.5.

An OD of the light-blocking area LBA of the anti-reflection layer 600 may be equal to or greater than about 1.3. An OD of the light-blocking area LBA may be controlled to an OD level of the black matrix by adjusting thicknesses of the color filter layer 610 and the reflection control layer 620 of the anti-reflection layer 600. Accordingly, the light-blocking area LBA has a light-blocking rate (e.g., OD) substantially similar to that of the black matrix.

FIGS. 10 through 12 respectively show transmittances of the color filter layer 610, the reflection control layer 620, and the light-blocking area LBA.

Referring to FIG. 10, the color filter layer 610 according to an embodiment may transmit light in a wavelength region from about 480 nm to about 600 nm, such as about 500 nm to about 580 nm, and may absorb light in other regions. Referring to FIG. 11, the reflection control layer 620 according to an embodiment may transmit light in a wavelength region from about 380 nm to about 480 nm and about 600 nm to about 780 nm and may absorb light in a wavelength region from about 480 nm to about 600 nm. As such, because the color filter layer 610 and the reflection control layer 620 may absorb light in different wavelength regions, the light-blocking area LBA at where the color filter layer 610 and the reflection control layer 620 overlap each other may act as a light-blocking layer.

Referring to FIG. 12, as in FIG. 9, "A" corresponds to a comparative example and shows a transmittance of a black matrix (BM), and "B" corresponds to an embodiment of the present disclosure and shows a transmittance of the light-blocking area LBA of the anti-reflection layer 600. As shown in FIG. 9, an OD of the black matrix and an OD of the light-blocking area LBA of the anti-reflection layer 600 are similar to each other, a transmittance of the light-blocking area LBA of the anti-reflection layer 600 shown in FIG. 12 is similar to a transmittance of the black matrix in a range from 380 nm to 780 nm.

Figure 13:
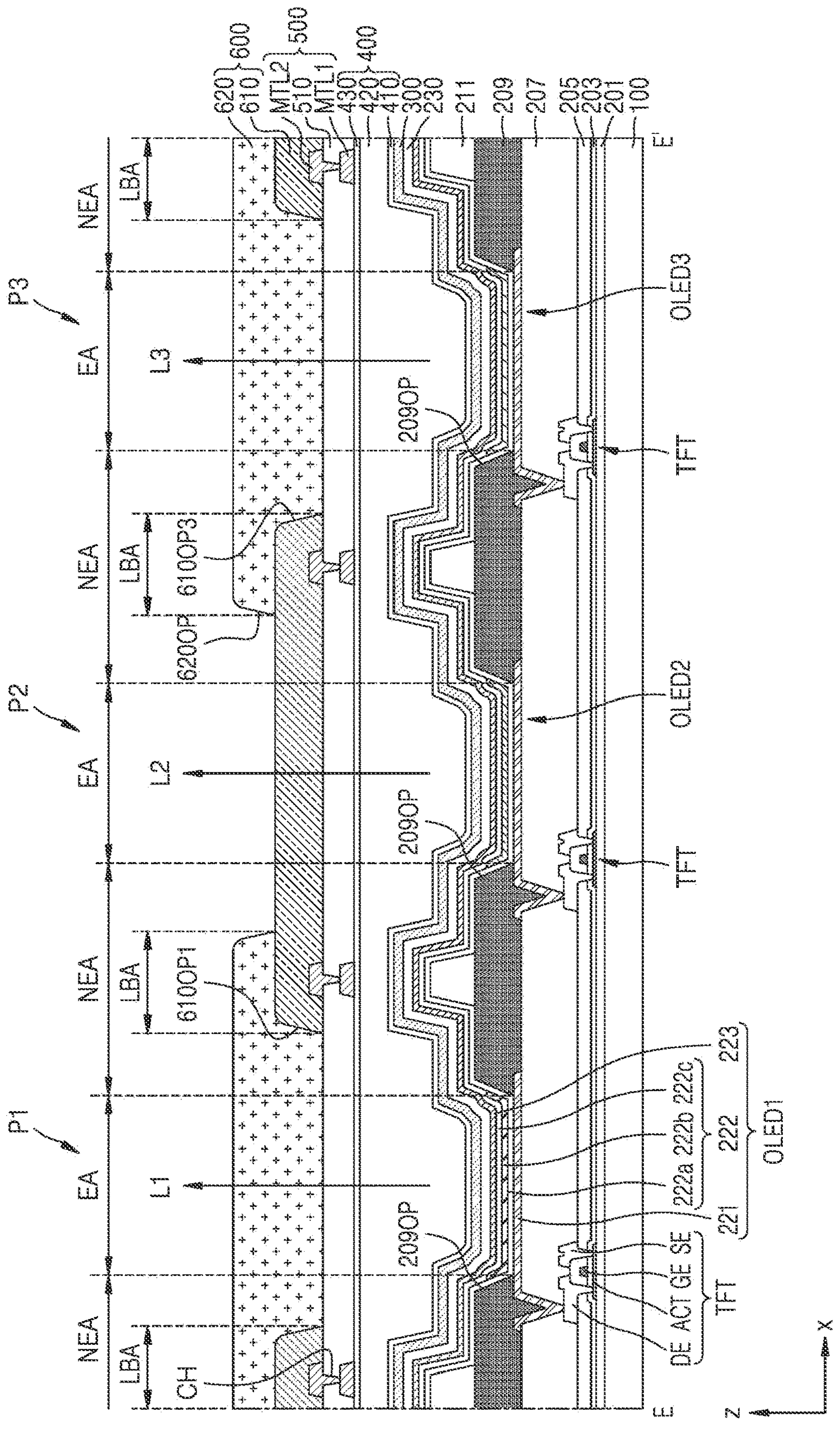
FIGS. 13 and 14 are cross-sectional views illustrating a part of a display apparatus, according to an embodiment.
Figure 14:
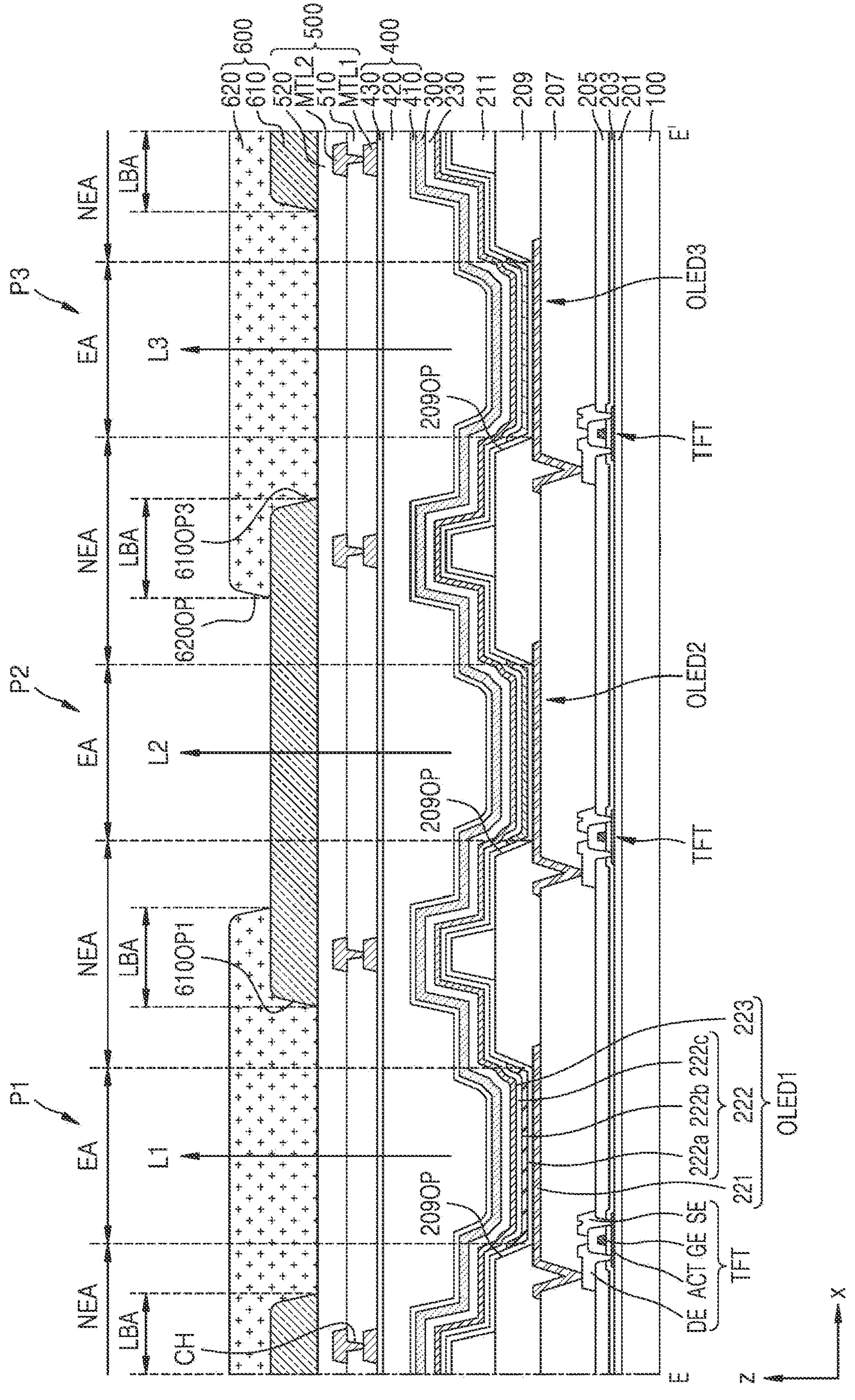

FIGS. 13 and 14 are cross-sectional views illustrating a part of a display apparatus according to an embodiments.

FIG. 13 is similar to an embodiment of FIG. 8 or the like but is different in that the second touch insulating layer 520 is not provided. Other elements are the same as in FIG. 8 or the like, and thus, the following will focus on differences therebetween.

Referring to FIG. 13, the anti-reflection layer 600 may be located directly on the second conductive layer MTL2. In an embodiment, because the color filter layer 610 is located directly on the second conductive layer MTL2, the second conductive layer MTL2 may be directly covered by the color filter layer 610. Because the second touch insulating layer 520 is omitted in the embodiment shown in FIG. 13, a part of the first touch insulating layer 510 may be exposed through the first opening 610OP1 and the third opening 610OP3 in the color filter layer 610.

According to the embodiment shown in FIG. 13, because the color filter layer 610 is located directly on the second conductive layer MTL2 without forming the second touch insulating layer 620 as in the embodiment shown in FIG. 8, a process may be simplified and a thickness of the touch sensing layer 500 may be reduced.

FIG. 14 is similar to FIG. 8 or the like but is different in the pixel-defining film 209. Other elements are the same as those in FIG. 8 or the like, and thus, the following will focus on differences therebetween.

Referring to FIG. 14, the pixel-defining film 209 may not include a light-blocking material. In such an embodiment, the pixel-defining film 209 may include the same material as or a similar material to that of the planarization layer 207.

According to the one or more embodiments, a display apparatus exhibiting improved visibility may be provided by reducing the reflection of external light. However, the scope of the present disclosure is not limited by the feature.

It should be understood that embodiments described herein should be considered in a descriptive sense and not for purposes of limitation. Descriptions of features or aspects within each embodiment should typically be considered as available for other similar features or aspects in other embodiments. While one or more embodiments have been described with reference to the figures, it will be understood by one of ordinary skill in the art that various changes in form and details may be made therein without departing from the spirit and scope as defined by the following claims and their equivalents.

What is claimed is:

1. A display apparatus comprising:

a substrate;

a first light-emitting device, a second light-emitting device, and a third light-emitting device on the substrate and having respective emission areas, the first light-emitting device, the second light-emitting device, and the third light-emitting device being configured to emit light having different wavelengths from each other;

a low-reflection layer on the first light-emitting device, the second light-emitting device, and the third light-emitting device, the low-reflection layer comprising an inorganic material;

a color filter layer on the low-reflection layer and configured to transmit light in a first wavelength region corresponding to the second light-emitting device; and a reflection control layer on the color filter layer and comprising a dye, a pigment, or a combination thereof, wherein the color filter layer has a first opening and a third opening respectively corresponding to the first light-emitting device and the third light-emitting device from among the first light-emitting device, the second light-emitting device, and the third light-emitting device, wherein the reflection control layer has a second opening corresponding to the second light-emitting device.

2. The display apparatus of claim 1, wherein a size of the second opening is smaller than each of the first opening and the third opening.

3. The display apparatus of claim 1, wherein the reflection control layer fills the first opening and the third opening.

4. The display apparatus of claim 1, wherein the color filter layer and the reflection control layer do not overlap each other in the respective emission areas of the first light-emitting device, the second light-emitting device, and the third light-emitting device.

5. The display apparatus of claim 4, wherein only the color filter layer from among the color filter layer and the reflection control layer is arranged to correspond to the second light-emitting device.

6. The display apparatus of claim 4, wherein only the reflection control layer from among the color filter layer and the reflection control layer is arranged to correspond to the first light-emitting device and the third light-emitting device.

7. The display apparatus of claim 1, wherein a non-emission area is between the emission areas, and wherein the non-emission area has a light-blocking area at where the color filter layer and the reflection control layer overlap each other.

8. The display apparatus of claim 7, wherein an optical density of the light-blocking area corresponding to the non-emission area is equal to or greater than 1.3.

9. The display apparatus of claim 1, wherein the first wavelength region is a range from 500 nm to 580 nm.

10. The display apparatus of claim 1, wherein the low-reflection layer comprises at least one of a metal and a metal oxide.

11. The display apparatus of claim 10, wherein the low-reflection layer comprises ytterbium (Yb), bismuth (Bi), cobalt (Co), molybdenum (Mo), titanium (Ti), zirconium (Zr), aluminum (Al), chromium (Cr), niobium (Nb), platinum (Pt), tungsten (W), indium (In), tin (Sn), iron (Fe), nickel (Ni), tantalum (Ta), manganese (Mn), zinc (Zn), germanium (Ge), silver (Ag), magnesium (Mg), gold (Au), copper (Cu), calcium (Ca), or a combination thereof.

12. The display apparatus of claim 10, wherein the low-reflection layer comprises $SiO_2$, $TiO_2$, $ZrO_2$, $Ta_2O_5$, $HfO_2$, $Al_2O_3$, ZnO, $Y_2O_3$, BeO, MgO, $PbO_2$, $WO_3$, SiNx, LiF, $CaF_2$, $MgF_2$, CdS, or a combination thereof.

13. The display apparatus of claim 1, wherein a refractive index of the low-reflection layer is equal to or greater than 1.

14. The display apparatus of claim 1, wherein an absorption coefficient of the low-reflection layer is equal to or less than 4.0.

15. The display apparatus of claim 1, wherein the first light-emitting device comprises a first pixel electrode, the second light-emitting device comprises a second pixel electrode, and the third light-emitting device comprises a third pixel electrode, wherein the display apparatus further comprises a pixel-defining film covering edges of the first pixel electrode, the second pixel electrode, and the third pixel electrode, the pixel-defining film having an opening portion through which a central portion of each of the first pixel electrode, the second pixel electrode, and the third pixel electrode is exposed, and wherein the pixel-defining film comprises a light-blocking material.

16. The display apparatus of claim 1, further comprising:

a thin-film encapsulation layer on the low-reflection layer; and a touch sensing layer on the thin-film encapsulation layer and comprising a conductive layer corresponding to a non-emission area between the emission areas, wherein the color filter layer is on the touch sensing layer.

17. The display apparatus of claim 16, wherein a width of an area where the color filter layer and the reflection control layer overlap each other is greater than a width of the conductive layer overlapping the area.

18. The display apparatus of claim 1, further comprising a capping layer on the first light-emitting device, the second light-emitting device, and the third light-emitting device, the capping layer comprising an organic material, wherein the low-reflection layer is directly on the capping layer.

* * * * *